United States Patent [19]

Stewart et al.

[11] Patent Number: 4,947,357

[45] Date of Patent: Aug. 7, 1990

[54] SCAN TESTING A DIGITAL SYSTEM USING SCAN CHAINS IN INTEGRATED CIRCUITS

[75] Inventors: W. Kem Stewart, Woburn; Lester M. Crudele, Groton; Jonathan L. Miller, Chestnut Hill; Marco E. Riera, Woburn; Bruce E. Schurmann, N. Andover, all of Mass.

[73] Assignee: Stellar Computer, Inc., Newton, Mass.

[21] Appl. No.: 159,898

[22] Filed: Feb. 24, 1988

[51] Int. Cl.⁵ .................... G01R 31/28; G01R 15/12; G06F 11/00
[52] U.S. Cl. ................................. 371/22.3; 364/490; 364/580
[58] Field of Search ...................... 364/580; 371/15, 20, 371/25; 324/73 R, 73 AT

[56] References Cited

U.S. PATENT DOCUMENTS

| | | | |
|---|---|---|---|
| 4,495,628 | 1/1985 | Zasio | 377/70 |
| 4,495,629 | 1/1985 | Zasio et al. | 377/70 |
| 4,553,236 | 11/1985 | Zasio et al. | 371/15 |
| 4,587,480 | 5/1986 | Zasio | 324/73 R |
| 4,621,363 | 11/1986 | Blum | 371/25 |
| 4,686,627 | 8/1987 | Donovan et al. | 364/481 |
| 4,752,907 | 6/1988 | Si et al. | 324/73 R |
| 4,782,283 | 11/1988 | Zasio | 324/73 R |
| 4,799,004 | 1/1989 | Mori | 324/73 R |

OTHER PUBLICATIONS

E. B. Eichelberger et al., "A Logic Design Structure for LSI Testability", Logic Design Structure, 1978, pp. 165–178.
L. A. Stolte et al., "Design for Testability of the IBM System/38", 1979 IEEE Test Conference, 1979, Session 2, pp. 29–36.
T. W. Williams et al., "Design for Testability-A Survey", Proceedings of the IEEE, vol. 71, No. 1, Jan. 1983, pp. 98–112.
E. I. Muehldorf et al., "LSI Logic Testing-An Overview", IEEE Transactions on Computers, vol. C-30, No. 1, Jan. 1981, pp. 1–16.
J. E. Smith, "Recovery from Transient Faults in Redundant Systems", IBM Technical Disclosure Bulletin, vol. 23, No. 4, Sep. 1980, pp. 1707–1709.
Internal Aida Corporation memo, Sep. 26, 1988.
J. J. Zasio, "Shifting Away from Probes for Wafer Test", STC Computer Research Corporation, Sunnyvale, Calif. 1982.
D. Komonytsky, "LSI Self-Test Using Level Sensitive Scan Design and Signature Analysis," 1982 IEEE Test Conference, pp. 414–424.
S. Yu et al., "Testing Functional Faults in Digital Systems Described by Register Transfer Language," 1981 IEEE Test Conf., pp. 447–457.
V. D. Agrawal et al., "Testability Measures—What do They Tell Us?", 1982 IEEE Test Conference, pp. 391–396.
E. J. McCluskey, "Built-In Self-Test Techniques" IEEE Design Test, Apr. 1985, pp. 21–28.

*Primary Examiner*—Felix D. Gruber
*Attorney, Agent, or Firm*—Fish & Richardson

[57] ABSTRACT

A digital system that includes a plurality of integrated circuits disposed on a circuit board, each integrated circuit comprising a plurality of scan chains, each scan chain scanning data from a scan input to a scan output in response to a scan clock; each scan input is coupled to a first pad of the integrated circuit, and the scan outputs are multiplexed to a second pad of the integrated circuit; the second pads of the integrated circuits are multiplexed to a port of the circuit board. A controller selects one of the integrated circuits for scanning, the controller selecting the second pad of the selected integrated circuit for coupling to the port of the circuit board; and the controller also selects one of the plurality of scan chains in the selected integrated circuit for scanning, the controller coupling the scan clock to the selected scan chain and selecting the scan output of the selected scan chain for coupling to the second pad of the selected integrated circuit.

4 Claims, 18 Drawing Sheets

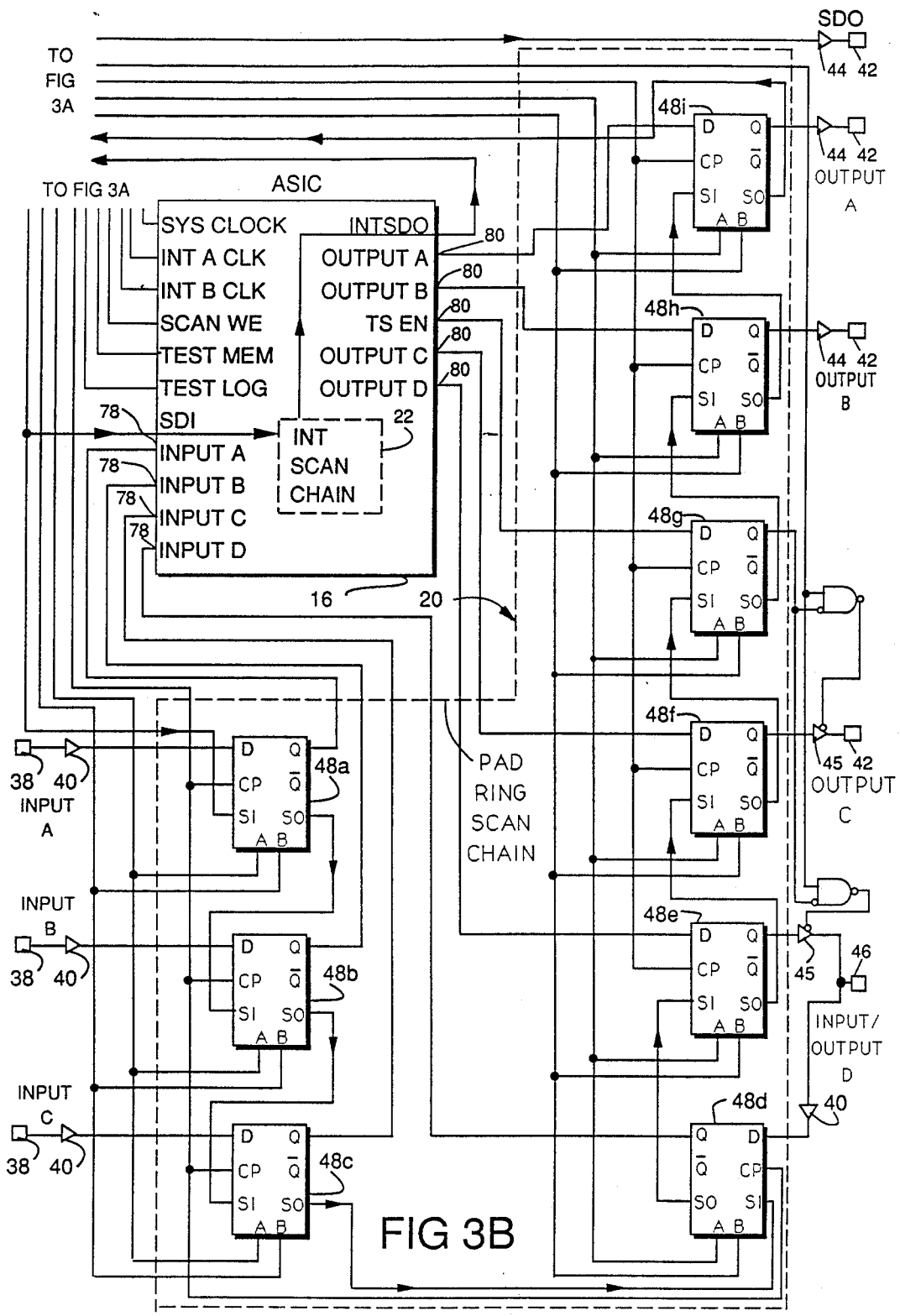

SCAN TESTING A DIGITAL SYSTEM USING SCAN CHAINS IN INTEGRATED CIRCUITS

BACKGROUND OF THE INVENTION

This invention relates to testing integrated circuits in a data processing system by scanning known input data to selected stimulus points in the integrated circuit and scanning correspondingly produced result data from selected observation points in the integrated circuit.

Scannable integrated circuits generally comprise one or more "scan chains" for applying known stimulus (i.e., test) data to the functional circuitry of the integrated circuit and observing data that results from one or more subsequent normal operating cycles. The scan chains are also useful for initializing the integrated circuit.

Some scannable integrated circuits include a scan chain comprising a set of latches interposed between the primary input, output and input/output (I/O) pads and the functional circuitry. The latches are transparent to data during normal operation and are configurable as serial shift registers for scanning. The serial data inputs and outputs of the latches are interconnected to form a single serial shift register, the input and output of which are connected to a pair of pads. This scan chain is known as a "pad ring" scan chain. The pad ring scan chain is useful for testing and/or initializing functional circuitry available to the primary input, output and I/O pads.

Conventional scan techniques, such as those described in Zasio, U.S. Pat. Nos. 4,495,628, 4,495,629, and 4,587,480, typically test the integrated circuit at the wafer level, that is, before the integrated circuit is packaged and installed in the system, for example, as part of a printed circuit board. Thus, the pads of the integrated circuit are unconnected to other devices, and the pad s scannable latches, when configured as shift registers, do not isolate the functional circuitry of the integrated circuit from the pads. Two different scannable latch configurations are used, one for input pads and one for output pads.

SUMMARY OF THE INVENTION

The invention features, in a first aspect, a scannable element adapted to be disposed between a pad and functional circuitry of an integrated circuit, the scannable element comprising a switch, responsive to a control signal, for coupling data between the pad and the functional circuitry in a first operating mode, and a latch for storing the data, and wherein the switch decouples the pad from the functional circuitry in a second operating mode. Thus, the functional circuitry may be selectively isolated from, for example, other integrated circuits connected to the pad. This permits the pad to be used as a stimulus and/or observation point for testing the functional circuitry with the integrated circuit in place on, for example, a circuit board with the other integrated circuits. Moreover, the pad can also be used as a stimulus and/or observation point for testing the other integrated circuits.

Preferred embodiments include the following features. The integrated circuit comprises a set of the scannable elements disposed between the functional circuitry and a corresponding set of pads, each scannable element comprising a scan input port coupled to the latch and a scan output port, the switch being disposed between the latch and the scan output port. The switch decouples the latch from the scan output port during the first operating mode and couples the latch to the scan output port during the second operating mode, and the scan input ports and scan output ports of the set of scannable elements are interconnnected to form a scan chain. The scannable element also includes a data input port and a data output port, with the switch coupling the data input port to the data output port and decoupling the latch from the data output port and the scan output port during the first operating mode, and the switch decoupling the data input port from the data output port and scan output port and coupling the latch to the data output port and the scan output port during the second operating mode.

Preferably, the latch comprises a pair of latch elements serially coupled between the scan input port and the scan output port through the switch, the pair of latch elements being responsive to a corresponding pair of scan clock signals during the second operating mode to shift a scan bit from the scan input port to the scan output port. Thus, the set of scannable elements respond to a plurality of pairs of the scan clock signals in the second operating mode to shift scan bits through the scan chain. A controller applies scan bits to the scan input port of the first scannable element in the scan chain and receives scan bits from the scan output port of the last scannable element in the scan chain. Thus, test data can be shifted (i.e., scanned) into the scan chain via the scan input and output ports for application to the functional circuitry or the other integrated circuits, and test result data, stored in the latches of the scannable elements, can be scanned out of the scan chain for evaluation, all with the integrated circuit in place on the circuit board.

In one embodiment, a first portion of the set of integrated circuit pads comprises input pads for the functional circuitry and a second portion of the set of integrated circuit pads comprises output pads for the functional circuitry. Preferably, a third portion of the set of integrated circuit pads comprises input/output (I/O) (i.e., bidirectional) pads for the functional circuitry, each I/O pad having a pair of the scannable elements associated therewith, with a first one of the pair of scannable elements coupling data from the functional circuitry to the I/O pad and a second one of the pair of scannable elements coupling data from the I/O pad to the functional circuitry.

The switch of a given scannable element is preferably adapted to couple a data bit present at the data input port of that element for storage by the element's latch during a control signal pulse, the switch isolating the data input port from the latch after the control signal pulse terminates. Thus, the data bit may be removed from the data input port and replaced with another data bit after the control signal pulse without affecting the data bit stored in the latch. The integrated circuit may also include at least one other scan chain, each scan chain being adapted to shift scan bits from a scan input thereof to a scan output thereof in response to a scan clock; each scan input is coupled to a pad of the integrated circuit; and a controller selects one of the scan chains for scanning, the controller coupling the scan clock to the selected scan chain and coupling the scan output of the selected scan chain to a pad of the integrated circuit. Thus, the plurality of scan chains may be independently scanned.

A second aspect of the invention features a digital system comprising a plurality of integrated circuits disposed on a circuit board, each integrated circuit comprising a plurality of scan chains, each scan chain scanning data from a scan input to a scan output in response to a scan clock, each scan input being coupled to a first pad of the integrated circuit, the scan outputs being multiplexed to a second pad of the integrated circuit, the second pads of the plurality of integrated circuits being multiplexed to a port of the circuit board; a controller selects one of the plurality of integrated circuits for scanning, the controller selecting the second pad of the selected integrated circuit for coupling to the port of the circuit board; and the controller also selects one of the plurality of scan chains in the selected integrated circuit for scanning, the controller coupling the scan clock to the selected scan chain and selecting the scan output of the selected scan chain for coupling to the second pad of the selected integrated circuit.

In a preferred embodiment, at least one of the plurality of scan chains in at least one of the plurality of integrated circuits comprises a set of scannable elements adapted to be disposed between a corresponding set of pads and functional circuitry of the integrated circuit; each scannable element comprises a switch, responsive to a control signal, for coupling data between the corresponding pad and the functional circuitry in a first operating mode, and a latch for storing the data, the switch decoupling the pad from the functional circuitry in a second operating mode. Thus, the functional circuitry of the integrated circuit is selectively isolated from its set of pads in the second operating mode, thereby allowing the functional circuitry to be tested, via the scan chain, with the integrated circuit in place on the circuit board; the integrated circuit can also be used as a stimulus and observation point for testing other integrated circuits on the circuit board via the scan chain and set of pads.

In a third aspect, the invention features a digital system comprising a plurality of circuit boards, each circuit board including a plurality of integrated circuits, each integrated circuit comprising a plurality of scan chains, each scan chain scanning data from a scan input to a scan output in response to a scan clock, each scan input being coupled to a first pad of the integrated circuit, the scan outputs being multiplexed to a second pad of the integrated circuit, the second pads of the plurality of integrated circuits of each circuit board being multiplexed to a port of said circuit board, the ports of the plurality of circuit boards being multiplexed to an output port; a controller selects one of the plurality of circuit boards for scanning, the controller selecting the port of the circuit board for coupling to the output port; the controller also selects one of the plurality of integrated circuits for scanning, the controller selecting the second pad of the selected integrated circuit for coupling to the selected port of the selected circuit board; and the controller further selects one of the plurality of scan chains in the selected integrated circuit for scanning, the controller coupling the scan clock to the selected scan chain and selecting the scan output of the selected scan chain for coupling to the selected second pad of the selected integrated circuit.

In a fourth aspect, the invention features an integrated circuit having functional circuitry accessed by a plurality of pads, comprising a pad ring scan chain comprising an interconnected set of the scannable elements disposed between a corresponding set of the pads and the functional circuitry, an internal scan chain comprising a set of interconnected general registers, configurable as shift registers for scanning, disposed within the functional circuitry, a memory embedded in the functional circuitry and having a write enable input supplied by the functional circuitry during normal operation, and a controller for switching from normal operation to selectively scan the pad ring scan chain and the internal scan chain, the controller disabling the memory write enable input whenever the pad ring scan chain or the internal scan chain is being scanned. Thus, the memory is prevented from being inadvertently written into when scanning any scan chain of the integrated circuit.

Preferred embodiments include the following features. The memory includes a random access memory or, alternatively, a register file. The integrated circuit also includes at least one tri-state driver coupled to a corresponding pad, the tri-state driver having an enable input supplied by the functional circuitry during normal operation; the controller disables the tri-state enable input whenever the pad ring scan chain or the internal scan chain is being scanned. Thus, the tri-state driver is prevented from being accidentally enabled during scanning, thereby avoiding a possibly damaging tri-state bus fight (e.g., with another integrated circuit or with an external tester). The controller comprises a set of scannable elements interconnected to form a control register scan chain scannable by the controller to load a predetermined control bit in each one of the control register's scannable elements. The controller disables the memory write enable input and said tri-state enable input whenever the control register scan chain is being scanned. A first control register scannable element selectively disables the memory write enable input, in accordance with the state of the control bit of the first control register scannable element, independently of whether any scan chain is being scanned. A second control register scannable element selectively disables the tri-state enable input, in accordance with the state of the control bit of the second control register scannable element, independently of whether any scan chain is being scanned.

Preferably, a first portion of the pad ring scannable elements are coupled between input pads and the functional circuitry, and a second portion of the pad ring scannable elements are coupled between the functional circuitry and output pads. The controller selectively switches the first portion of the pad ring scannable elements from a first operating mode to a second operating mode to isolate the functional circuitry from the input pads, and the controller selectively switches the second portion of the pad ring scannable elements from the first operating mode to the second operating mode to isolate the output pads from the functional circuitry. In some embodiments, the controller switches both the first and second portions of the pad ring scannable elements to the second operating mode whenever either the pad ring scan chain, internal scan chain, or control register scan chain is being scanned. In other embodiments, a third control register scannable element selectively switches the first portion of the pad ring scannable elements between the first operating mode and the second operating mode, in accordance with the state of the control bit in the third control register scannable element, independently of whether any scan chain is being scanned. A fourth control register scannable element selectively switches the second portion of the pad ring scannable elements between the first operating mode and the second operating mode, in accordance with the state of the control bit in the fourth control register scannable element, independently of whether any scan chain is being scanned.

Other embodiments include the following features. The memory includes inputs supplied by outputs of a first portion of the functional circuitry during normal operation, the integrated circuit further comprising a multiplexer for selectively coupling either the outputs of the first portion of the functional circuitry or corresponding ones of the integrated circuit pads to the memory inputs selectively in response to a control signal. A fifth control register scannable element provides the control signal for the memory input multiplexer in accordance with the state of the control bit in the fifth control register scan element. The memory also includes an output for driving an input of a second portion of the functional circuitry during normal operation, the integrated circuit further comprising a first multiplexer for selectively coupling the memory output to a corresponding one of the integrated circuit pads selectively in response to a control signal. The fifth control register scannable element also provides the control signal for the first memory output multiplexer in accordance with the state of the control bit in the fifth control register scannable element. Thus, the memory can be isolated from the first and second portions of the functional circuitry and directly accessed by the pads for testing.

In some embodiments, the integrated circuit includes means for testing the first portion of the functional circuitry, the testing means comprising at least one of the set of general registers, which has data outputs coupled to inputs of the first portion of the functional circuitry, and a test register, having data inputs supplied by the memory input multiplexer, the test register being configurable as a shift register and having a scan input port and a scan output port interconnected with scan input ports and scan output ports of the set of general registers in the internal scan chain; the controller tests the first portion of the functional circuitry by: scanning test data into the at least one general register via the scan input port thereof to apply the test data via the data outputs thereof to the first portion of the functional circuitry; loading result data generated by the first portion of the functional circuitry into the test register via the multiplexer and the data inputs of the test register; and scanning the result data out of the test register via the scan output port thereof.

In other embodiments, the integrated circuit includes means for testing the second portion of the functional circuitry, the testing means comprising at least one of the set of general registers, which has data inputs coupled to outputs of the second portion of the functional circuitry, and a test register, having data outputs coupled to a second memory output multiplexer along with the memory output, the test register being configurable as a shift register and having a scan input port and a scan output port interconnected with scan input ports and scan output ports of the set of general registers in the internal scan chain; the controller tests the second portion of the functional circuitry by: scanning test data into the test register via the scan input port thereof; selecting the second memory output multiplexer to apply the test data from the data outputs of the test register to the second portion of the functional circuitry; loading result data generated by the second portion of the functional circuitry into the general register via the data inputs of the general register; and scanning the result data out of the general register via the scan output port thereof. A sixth control register scannable element provides control for the second memory output multiplexer in accordance with the state of the control bit in the sixth control register scannable element.

Other embodiments feature the integrated circuit having data comprising an identification code for the integrated circuit applied to a portion of the pads, a corresponding portion of the control register scannable elements having data inputs coupled to the portion of the pads; the portion of the control register scannable elements is adapted to store the identification code data therein in response to a control signal. Thus, the identification code data may be scanned from the control register scan chain.

In a fifth aspect, the invention features a method of testing an integrated circuit with an external testing device, the integrated circuit having a first scan chain disposed between pads and functional circuitry of the integrated circuit, and the functional circuitry having a second scan chain disposed therein, the method comprising the steps of: (a) scanning an internal test data word from the testing device into the second scan chain to apply the internal test data word to the functional circuitry; (b) applying an external test data word from the testing device to a portion of the pads corresponding to inputs of the functional circuitry; (c) opening a portion of the first scan chain corresponding to the input pads to couple the external test data word through the input portion of the first scan chain and apply the external test data word to the inputs of the functional circuitry; (d) coupling outputs produced by the functional circuitry in response to the internal and external test data words through a portion of the first scan chain to pads corresponding to the outputs of the functional circuitry for receipt by the testing device; (e) closing the input portion of the first scan chain to decouple the input pads from the inputs of the functional circuitry; (f) advancing the state of the functional circuitry after the input portion of the first scan chain has been closed to cause the functional circuitry to generate result data based on the internal and external test data words, the result data being loaded in the second scan chain; and (g) scanning the result data from the second scan chain to the testing device for evaluation.

Preferred embodiments include the following features. The external test data word is removed from the input pads before the state is advanced, the removal of the external test data word and the closing of the input portion of the first scan chain preventing an output signal which may be generated by an input of the functional circuitry when the state is advanced (i.e., by an I/O port of the functional circuitry) from being applied to the testing device and from conflicting with the external test data word at the testing device. A memory in the integrated circuit is disabled from being written into during the scanning steps. This prevents inadvertent writing into the memory during scanning. A tri-state driver in the integrated circuit is disabled from operating during the scanning steps. This avoids a possibly damaging tri-state bus fight from accidentally occurring between the tri-state driver and the testing device during scanning.

In a sixth aspect, the invention features a method of testing an integrated circuit in place on a circuit board and interconnected to other integrated circuits on the circuit board, the integrated circuit having a first scan chain disposed between pads and functional circuitry of the integrated circuit, and the functional circuitry having a second scan chain disposed therein, the method comprising the steps of: (a) closing the first scan chain to isolate inputs and outputs of the functional circuitry from the other integrated circuits; (b) scanning an internal test data word into the second scan chain to apply the internal test data word to the functional circuitry; (c) scanning an external test data word into a portion of the first scan chain corresponding to the inputs of the functional circuitry to apply the external test data word to the inputs of the functional circuitry; (d) strobing a portion of the first scan chain coupled to outputs of the functional circuitry to latch output signals produced by the functional circuitry in response to the internal and external test data words in the output portion of the first scan chain while maintaining the outputs of the functional circuitry isolated from the output pads; (e) advancing the state of the functional circuitry to cause the functional circuitry to generate result data based on the internal and external test data words, the result data being loaded in the second scan chain; (f) scanning the result data out of the second scan chain for evaluation; (g) scanning the latched output signals out of the first scan chain for evaluation; and (h) opening the first scan chain to couple the inputs and the outputs of the functional circuitry to the other integrated circuits. This procedure allows the integrated circuit to be fully tested in place on the circuit board without interference from, or without interfering with, other integrated circuits on the circuit board.

Preferred embodiments include the following features. Each memory on any integrated circuit on the circuit board is disabled from being written into during the scanning steps. Tri-state devices in integrated circuits on the circuit board are disabled from operating during the scanning steps. The tri-state devices of the integrated circuit being tested are disabled during the testing of that integrated circuit. The first scan chains in other integrated circuits on the circuit board are closed during the scanning steps.

In a seventh aspect, the invention features a method of testing connectivity between a plurality of integrated circuits on a circuit board, the plurality of integrated circuits having input and output pads interconnected via external connection circuitry, each integrated circuit comprising a scan chain disposed between functional circuitry and the input pads and the output pads of the integrated circuit, the method comprising the steps of: (a) closing the scan chain of each one of the plurality of integrated circuits to isolate inputs and outputs of the functional circuitry of the plurality of integrated circuits from the other integrated circuits on the circuit board; (b) for each integrated circuit having output pads coupled to the external connection circuitry, scanning test data into a portion of the scan chain corresponding to the output pads to apply the test data to the external connection circuitry; (c) for each integrated circuit having input ports coupled to the external test circuitry, strobing a portion of the scan chain corresponding to the input pads to latch result data produced by the external connection circuitry, based on the test data, into the input portion of the scan chain; (d) scanning the result data out of the scan chain for evaluation; and (e) opening the scan chains of the plurality of integrated circuits to couple the inputs and outputs of the functional circuitry of the plurality of integrated circuits together via said external connection circuitry.

In a preferred embodiment, additional test data is scanned into a test register disposed in the external connection circuitry to apply the additional test data to a first portion of the external connection circuitry; additional result data, produced by a second portion of the external connection circuitry in response to the test data supplied by the plurality of integrated circuits, is latched into the test register, and the additional result data is scanned out of the test register for evaluation.

Other features and advantages of the invention will be apparent from the following description and from the claims.

DESCRIPTION OF THE PREFERRED EMBODIMENT

We first briefly describe the drawings.

FIGS. 3A and 3B are a combined a schematic and block diagram of an integrated circuit of the printed circuit board of FIG. 2.

STRUCTURE AND OPERATION

Figure 1:
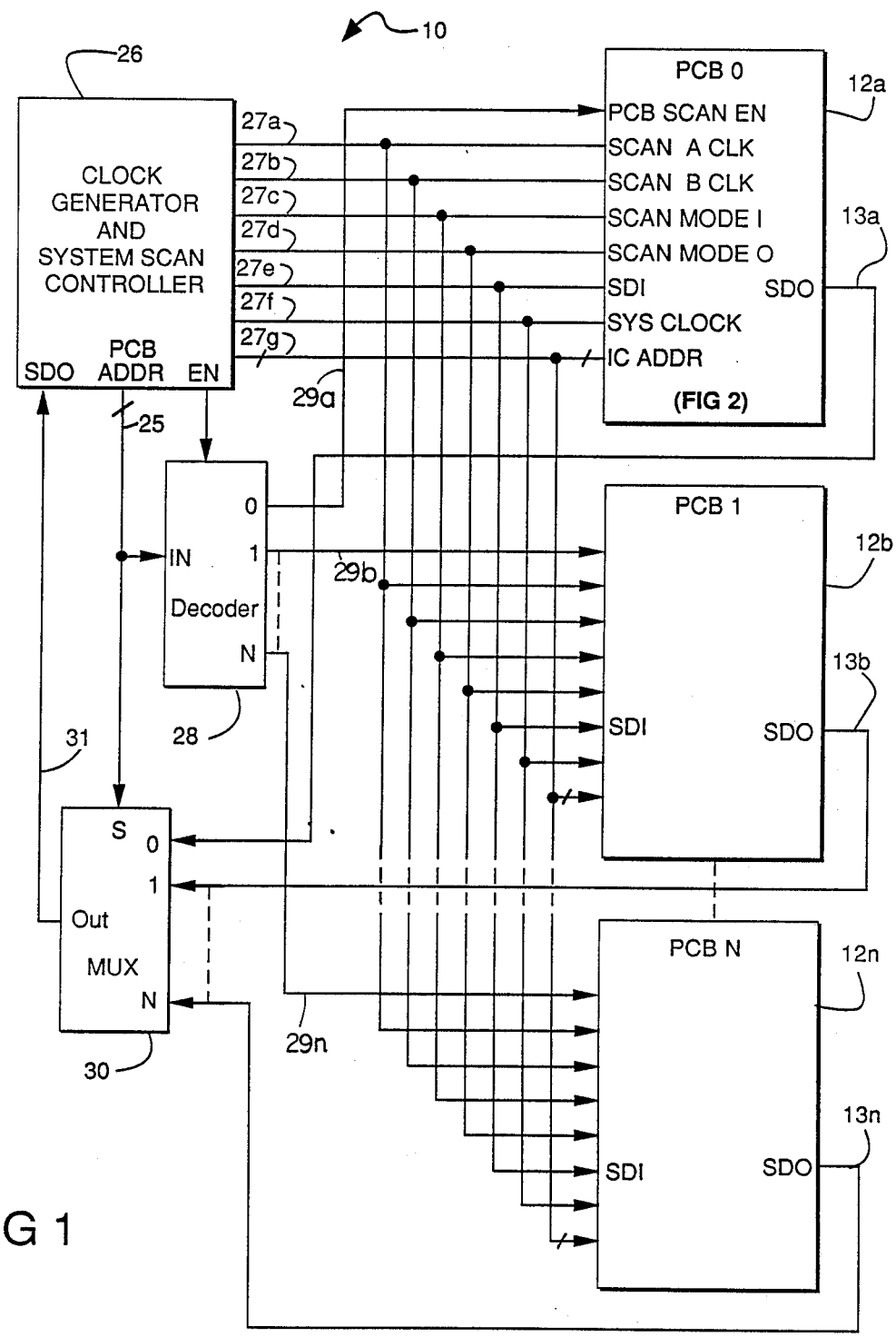
FIG. 1 is a block diagram of a computer system.
Figure 2:
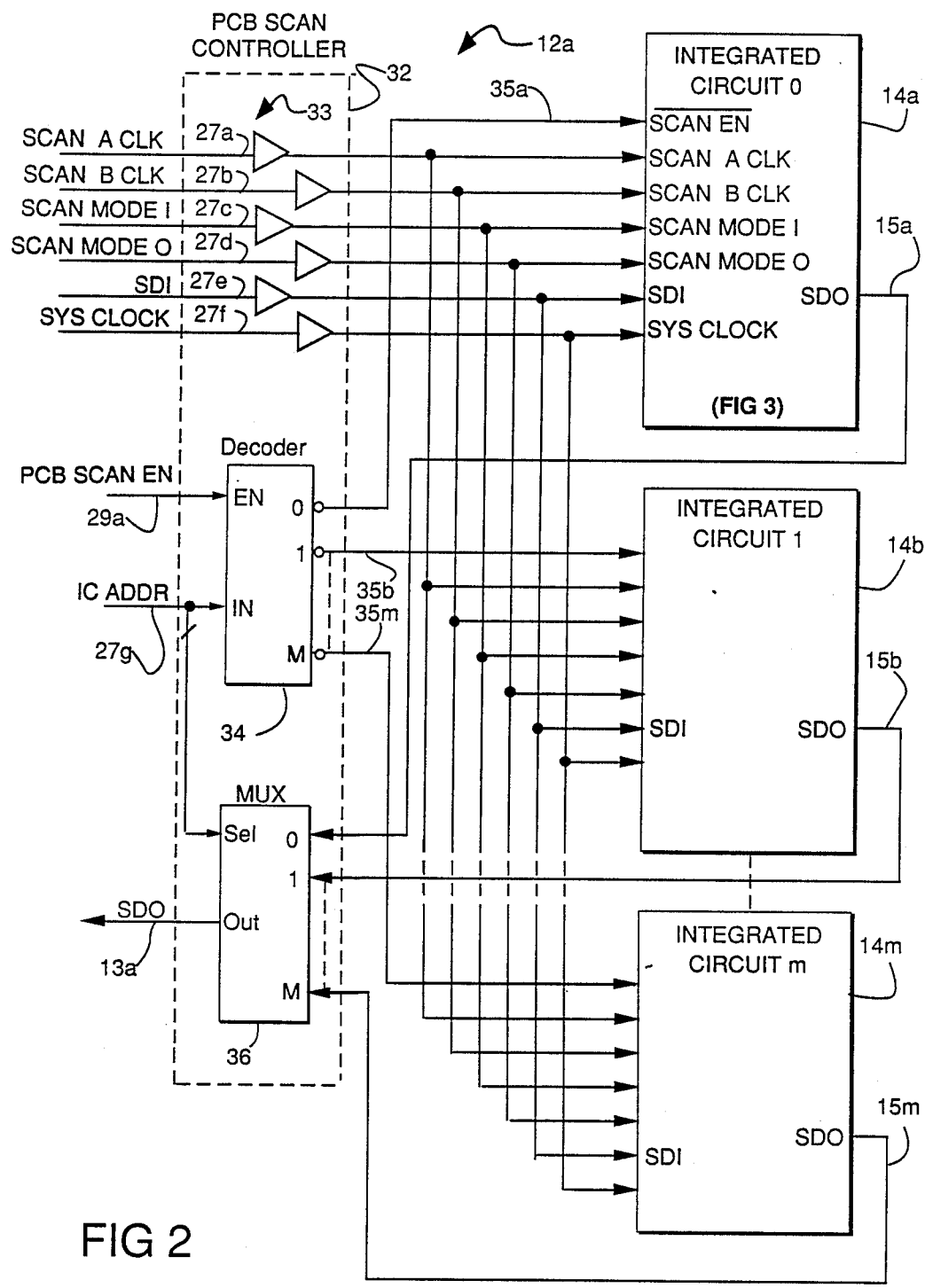
FIG. 2 is a block diagram of a printed circuit board in the computer system of FIG. 1.
Figure 3A:
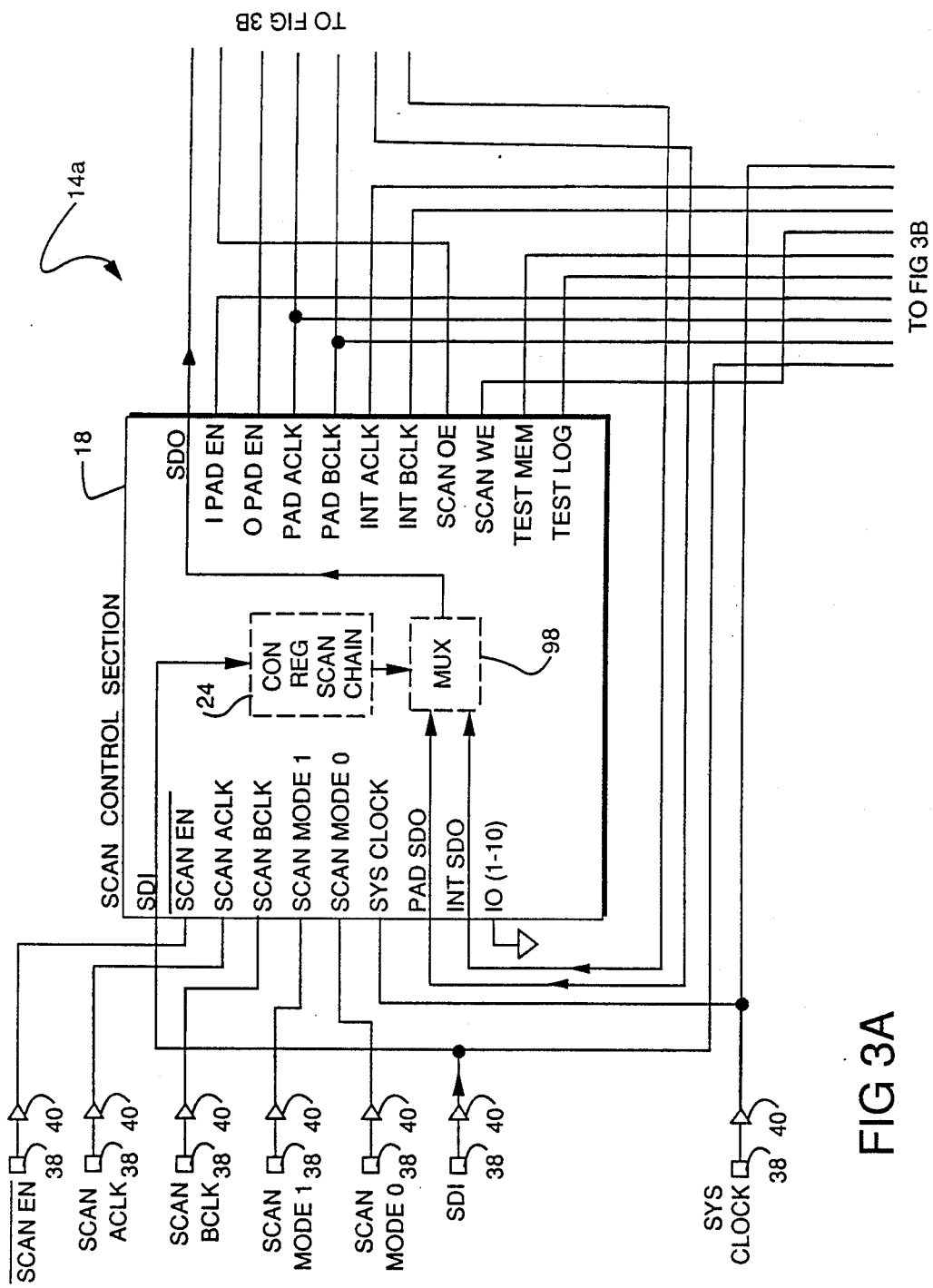

Referring to FIG. 1, the functional circuitry of computer system 10 is distributed in a number N of printed circuit boards (PCBs) 12a–12n, each PCB 12a–12n having a unique address (PCB ADDR) in computer system 10. Referring to FIG. 2, each PCB 12a–12n includes a number M of integrated circuits (ICs) 14a–14m, each with its own address (IC ADDR) on the printed circuit board. Referring to FIGS. 3A and 3B, each integrated circuit 14a–14m comprises, for example, scannable application specific integrated circuitry (asic) 16 (i.e., operational circuitry) and a scan control section 18. Each integrated circuit 14a–14m includes three scan chains described in detail below: pad ring scan chain 20 at the periphery of the integrated circuit; internal scan chain 22 within asic 16; and control register scan chain 24 within scan control section 18.

Referring again to FIG. 1, the operation of computer system 10 is directed by clock generator and system scan controller 26, which provides PCBs 12a–12n and ICs 14a–14m with an operational clock (SYS CLOCK) on line 27f and a pair of nonoverlapping clocks (SCAN ACLK, SCAN BCLK) on lines 27a, 27b, respectively, for scanning. System scan controller 26 selects a printed circuit board 12a-12n for scanning by enabling decoder 28 and applying the selected PCB's unique address (PCB ADDR) on bus 25 to decoder 28, which in turn applies an enable signal (PCB SCAN EN) to the selected PCB 12a-12n via a corresponding one of lines 29a-29n. The integrated circuit 14a-14m on that PCB which is to be scanned is selected by system scan controller 26 generating the unique address (IC ADDR) of the selected integrated circuit 14a-14m on bus 27g. System scan controller 26 selects the scan chain 20, 22, 24 which is to be scanned by producing a two-bit scan mode word (SCAN MODE 1, SCAN MODE 0) on lines 27c, 27d, respectively, as discussed in detail below.

Data to be scanned into the selected scan chain 20, 22, 24 is applied by system scan controller 26 on line 27e in parallel to the SDI (serial data input) ports of all PCBs 14a-14m. Data scanned from the PCBs are available at the SDO (serial data output) ports of PCBs 12a-12n on corresponding lines 13a-13n and applied to multiplexer (mux) 30, which is also controlled by PCB ADDR. Thus, only the data scanned from the selected PCB 12a-12n is applied (via line 31) to the SDO input of system scan controller 26.

Referring again to FIG. 2, each PCB 12a-12n includes a PCB scan controller 32, which passes along the clocks, scan mode signals and SDI from system scan controller 26 to all integrated circuits 14a-14m on the board via buffers 33. PCB scan controller 32 includes a decoder 34 and multiplexer 36 selectable by the IC ADDR generated by system scan controller 26. In addition, decoder 34 is enabled by the PCB SCAN EN signal from decoder 28. Decoder 34 provides a SCAN EN signal on the one of lines 35a-35m corresponding to the integrated circuit 14a-14m selected by the IC ADDR signal. Likewise, the scan data output (SDO) generated by the selected integrated circuit 14a-14m is coupled on the associated one of lines 15a-15m through mux 36 as the SDO output of the printed circuit board, and is applied to the SDO input of system scan controller 26 via mux 30 (FIG. 1).

Referring again to FIGS. 3A and 3B, access to each integrated circuit 14a-14m (for example, integrated circuit 14a) from the other integrated circuits on the PCB and other printed circuit boards is provided via a set of input pads 38 and associated input buffers 40, a set of output pads 42 and associated output drivers 44 (one or more of which is a tri-state driver 45), and one or more input/output (I/O) pads 46 connected to a buffer 40 and a tri-state driver 45. Pad ring scan chain 20 includes a set of elements 48a-48c, disposed between input pads 38 (for a set of primary input signals A, B, and C) and inputs of asic 16; elements 48d, 48e located between I/O pad 46 and an input and output, respectively, of asic 16 (for primary input/output signals D); and elements 48f-48i, interposed between outputs (i.e., for primary output signals A-C) of asic 16 and output pads 42.

Figure 4:
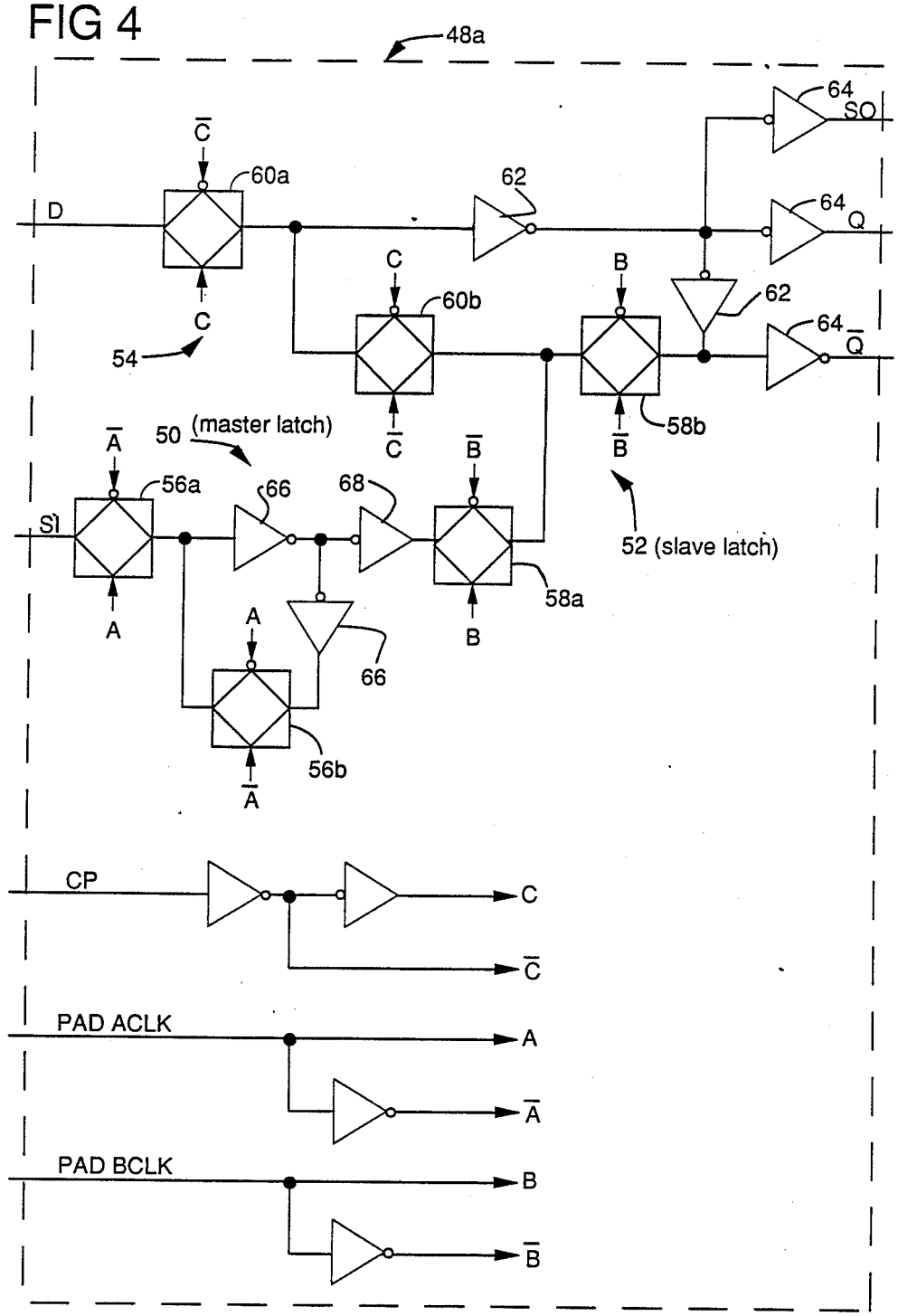
FIG. 4 is a schematic diagram of a scannable element in the integrated circuit of FIGS. 3A and 3B.

Elements 48a-48i are identical and are described in detail below in connection with FIG. 4. Elements 48a-48i are configurable in response to control signals, applied to their CP ports from scan control section 18, to be either: "open" to directly couple signals between the associated pad and asic 16 via the D and Q ports thereof (when the signals applied to their CP ports are a logic high); or "closed" when logic low signals are applied to their CP ports to latch the signals present at their D inputs and isolate asic 16 from associated pads 38, 42, 46. Elements 48a-48i are also operable as one-bit serial shift registers via their shift register serial input (SI) ports and shift register serial output (SO) ports for scanning the integrated circuit. The SI and SO ports of successive elements 48a-48i are chained together to form a nine-bit serial shift register having a single data input (the SI port of element 48a) and a single data output (the SO port of element 48i).

The internal scan chain 22 of asic 16 likewise is configured as a serial shift register having a serial data input, internally connected to the SDI port of asic 16, and a serial data output, available at the INT SDO port of asic 16. Similarly, control register scan chain 24 is configured as a serial shift register having a serial data input at the SDI port of scan control section 18 and generating a serial data output. Scan chains 22, 24 are described in more detail below.

The serial data inputs of scan chains 20, 22, 24 are connected together and to SDI input pad 38, which receives the SDI signal on line 27e from system scan controller 26 (FIG. 1) via PCB scan controller 32 (FIG. 2). As discussed in detail below, the serial data outputs of scan chains 20, 22, 24 are multiplexed in mux 98 of scan control section 18, with a selected scan chain serial data output being coupled to the SDO port of scan control section 18 and to output pad 42 as the SDO output of the integrated circuit 14a-14m. Referring to FIG. 4, representative scannable element 48a is shown in detail. Element 48a comprises master latch element 50, slave latch element 52 and pad isolation switch 54, each driven by complementary control signals A-$\overline{A}$, B-$\overline{B}$, C-$\overline{C}$, respectively. Referring also to FIGS. 1-3, control signals A-$\overline{A}$ and B-$\overline{B}$ are derived from PAD ACLK and PAD BCLK signals, respectively, supplied to elements 48a-48i by scan control section 18. The PAD ACLK, PAD BCLK signals are produced by scan control section 18 from the pair of nonoverlapping shift register clock signals (SCAN ACLK, SCAN BCLK, respectively) supplied on lines 27a, 27b by system scan controller 26. Control signals C, $\overline{C}$ are derived from a "clock pulse" (CP) control signal applied by scan control section 18 to the CP port of the element. Scan control section 18 applies separate CP control signals (I PAD EN, O PAD EN) to the CP ports of input pad elements 48a-48d and output pad elements 48e-48i, respectively, for purposes to be discussed.

Master latch 50 includes a pair of transmission gates 56a, 56b driven to opposite states of conduction by control signals A, $\overline{A}$. That is, when transmission gate 56a is "ON" (i.e. conducting), transmission gate 56b is "OFF" (i.e. nonconducting). Similarly, transmission gates 58a, 58b which comprise slave latch 52 are always in opposite states of conduction in response to control signals B, $\overline{B}$, as are the pair of transmission gates 60a, 60b of isolation switch 54 in response to control signals C, $\overline{C}$.

In operation, in a normal operating mode (i.e., when none of the scan chains 20, 22, 24 of any integrated circuit 14a-14m on any PCB 12a-12n are being scanned), the signal applied to port CP is asserted (i.e. is a logic high) and PAD ACLK, PAD BCLK are both low. Thus, transmission gate 60a is ON, allowing an input signal at port D to be coupled directly through element 48a to port Q (and ports Q, SO) via inverters 62, 64. Element 48a is thus "open" and is transparent to input signals applied to port D (neglecting the slight delay by gate 60a and inverters 62, 64).

In a scan mode of operation (i.e., when any scan chain 20, 22, 24 anywhere in system 10 is being scanned), the control signal applied to port CP is reset to a logic low, thereby turning transmission gate 60a OFF and transmission gate 60b ON, "closing" element 48a and isolating the output ports (Q, $\overline{Q}$, SO) of element 48a from input port D. Thus, in the scan mode, the asic 16 in each integrated circuit 14a–14m on each PCB 12a–12n is electrically isolated by elements 48a–48i from the pads 38, 42, 46 (FIG. 3) normally used to couple primary input and primary output signals (input A-input D, output A-output D) to and from asic 16.

Referring also to FIGS. 3A and 3B, in the scan mode, data is serially shifted through elements 48a–48i of pad ring scan chain 20 by alternately asserting PAD ACLK and PAD BCLK. Additionally, with pad ring 20 "closed" (i.e., PAD ACLK, PAD BCLK, and the signals applied to the CP ports of elements 48a–48i all being logic low), data present at the D inputs of one or more pad ring elements 48a–48i is "captured" or latched into slave latches 52 of such one or more elements 48a–48i by pulsing the signals applied to the CP ports of those elements (i.e. "strobing" the elements). This momentarily "opens" the strobed elements (during the pulse) to couple the signals of the D ports to slave latches 52 via transmission gates 60a. The strobed elements become "closed" at the termination of the CP pulse, turning transmission gates 60a OFF and gates 60b ON, thereby latching the data into slave latches 52 of the strobed elements. The captured data is shifted out of pad ring 20 by alternately pulsing PAD ACLK, PAD BCLK.

For example, the data bit latched into slave latch 52 of element 48a is shifted into master latch 50 of element 48b (via the SO port of element 48a and the SI port and transmission gate 56a of element 48b) by pulsing PAD ACLK once. In element 48b, the data bit is coupled through transmission gate 56a after SCAN ACLK becomes high and through transmission gate 56b (via inverters 66) after PAD ACLK returns to a logic low state. The data bit is shifted into slave latch 52 of element 48b by pulsing PAD BCLK once, the bit being coupled through transmission gate 58a (via inverter 68) when PAD BCLK is a logic high and being coupled (via conducting transmission gate 60b and inverters 62) through transmission gate 58b after PAD BCLK returns to a logic low.

It is noted that pad ring scan chain 20 has another mode of operation, the "flow through" mode. In this operating mode, both PAD ACLK and PAD BCLK are held at a logic high level and the signals applied to the CP ports of elements 48a–48i held logic low. This turns ON transmission gates 56a, 58a, and 60b in each element 48a–48i, creating a continuous signal path from the SI port of element 48a through the SO port of element 48i. This allows all latches 50, 52 in elements 48a–48i to be rapidly initialized to a common logic state (e.g., logic low) supply by applying a logic low signal to the SI port of element 48a and allowing the signal to propagate to the SO port of element 48i. PAD ACLK and PAD BCLK are then reset, thereby latching the common logic state in latches 50, 52 of every element 48a–48i.

Figure 5:
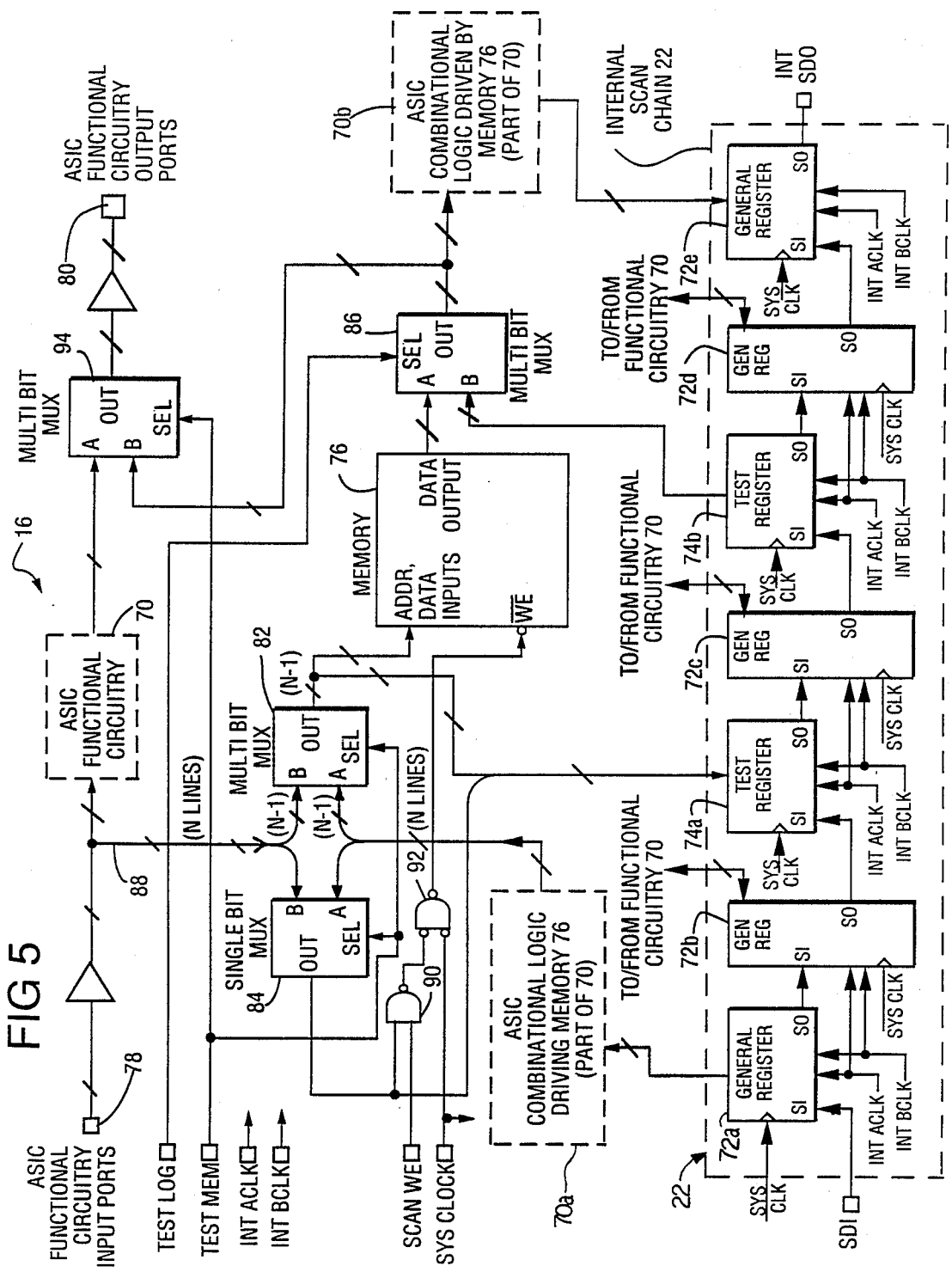
FIG. 5 is a schematic and block diagram of a section of the integrated circuit of FIGS. 3A and 3B.

Referring to FIG. 5, each asic 16 in computer system 10 includes functional circuitry 70 which includes a set of general registers, only five of such registers 72a–72e being shown. Registers 72a–72e are part of internal scan chain 22 (FIG. 3) and thus are shown separated from functional circuitry 70 for clarity. During a normal mode of operation, general registers 72a–72e operate using SYS CLOCK from integrated circuit input pad 38 (FIG. 3). Registers 72a–72e are also operable as serial shift registers upon application of a pair of shift register clocking signals (INT ACLK, INT BCLK) from scan control section 18. INT ACLK, INT BCLK are also derived by scan control section 18 from the nonoverlapping SCAN ACLK, SCAN BCLK signals, respectively, generated by system scan controller 26.

Each register 72a–72e includes a serial input (SI) port and a serial output (SO) port, the SI and SO ports being chained as shown with scannable test registers 74a, 74b to form the aforementioned internal scan chain 22. Test registers 74a, 74b are added to facilitate scan testing of portions 70a, 70b of functional circuitry 70 and memory 76, as described in detail below. The SI port of the first register in internal scan chain 22 (i.e., general register 72a) is connected to the SDI port of asic 16, and the INT SDO port of asic 16 is connected to the SO port of the last register in internal scan chain 22 (i.e., general register 72e).

Asic memory 76 is embedded within functional circuitry 70 but is shown separate from circuitry 70 for clarity. Memory 76 can be any kind of memory device, for example, random access memory (RAM) or register files. The various RAM and register file input terminals (such as write enable ($\overline{WE}$), address (ADDR) and data inputs) are not directly accessible to the asic's functional circuitry input ports 78 (i.e., the ports to which primary inputs A–D (FIGS. 3A and 3B) are applied) during normal operation. Nor are the data outputs of memory 76 applied directly to asic output ports 80 (i.e., the ports where primary outputs A–D, TS EN (FIGS. 3A and 3B) are produced) during normal operation. Rather, input ports 78 are applied to asic functional circuitry 70, a portion of which (i.e., logic network 70a) provides the $\overline{WE}$, ADDR, and data inputs for memory 76 during normal operation. Similarly, during normal operation the data outputs of memory 76 are applied to logic network 70b within asic functional circuitry 70, from which output signals are generated at asic ports 80 which typically do not directly represent the states of the memory outputs.

Logic networks 70a, 70b thus make it difficult to directly access the terminals of memory 76 during scanning and test. Thus, a set of 2-to-1 multiplexers 82 is provided at the memory's ADDR and data inputs, 2-1 multiplexer 84 is provided at the $\overline{WE}$ input, and a set of 2-1 multiplexers 86 is connected to the memory's data outputs. The "A" inputs of muxes 82, 84 are supplied by logic network 70a. Lines 88 are added between one or more of asic input ports 78 and the "B" inputs of muxes 82, 84. The outputs of muxes 82 are applied to the ADDR and data inputs of memory 76 under the control of a TEST MEM control signal from scan control section 18, thereby enabling memory 76 to be driven directly from the asic's input ports 78. Likewise, the TEST MEM control signal operates mux 84 to provide the $\overline{WE}$ signal for memory 76 via gates 90, 92.

The outputs of muxes 82, 84 are also coupled to the data inputs of test register 74a. The data outputs of general register 72a provide direct inputs for functional logic 70a. Thus, logic 70a (which may comprise, for example, difficult to test combinatorial circuitry) is isolated from the remainder of functional circuitry 70 and tested directly by scanning (in a manner discussed in detail below) known stimulus data (i.e., test signals)

into general register 72a via the SI port thereof, applying the test signals to logic 70a via the data outputs of general register 72a, and capturing the resulting output signals produced by logic 70a in test register 74a (via muxes 82, 84). The results are thus available simply by scanning the result data out of test register 74a in the manner discussed in detail below.

The "A" inputs of muxes 86 receive the memory's data outputs, and the "B" inputs of muxes 86 are supplied by the data outputs of test register 74b. Muxes 86, in accordance with a TEST LOG control signal (from scan control section 18), applies either the data outputs of memory 76 or the contents of test register 74b to functional circuitry 70b and to the "B" inputs of another set of 2-to-1 multiplexers 94. Thus, functional circuitry 70b is tested by applying known inputs (previously scanned into test register 74b) to functional circuitry 70b via muxes 86 in place of the memory data outputs. Functional circuitry 70b provides data inputs for general register 72e; thus, the signals produced by circuitry 70b in response to the test signals from register 74b are loaded in general register 72e and are available by scanning such data out of general register 72e of internal scan chain 22 as discussed in detail below. Thus, functional circuitry 70b (comprising, for example, difficult to test combinatorial logic) is isolated from the remainder of asic 16 and directly tested.

The "A" inputs of muxes 94 are driven by asic functional circuitry 70, and muxes 94 are controlled by the TEST MEM signal. During normal operation, outputs of asic functional circuitry 70 are applied through muxes 94 to asic output ports 80 (e.g., as primary outputs A-D), while during a memory test the data outputs of memory 76 are applied to output ports 80, via muxes 86, 94. This allows data outputs of memory 76 to be sampled directly.

Figure 6A:
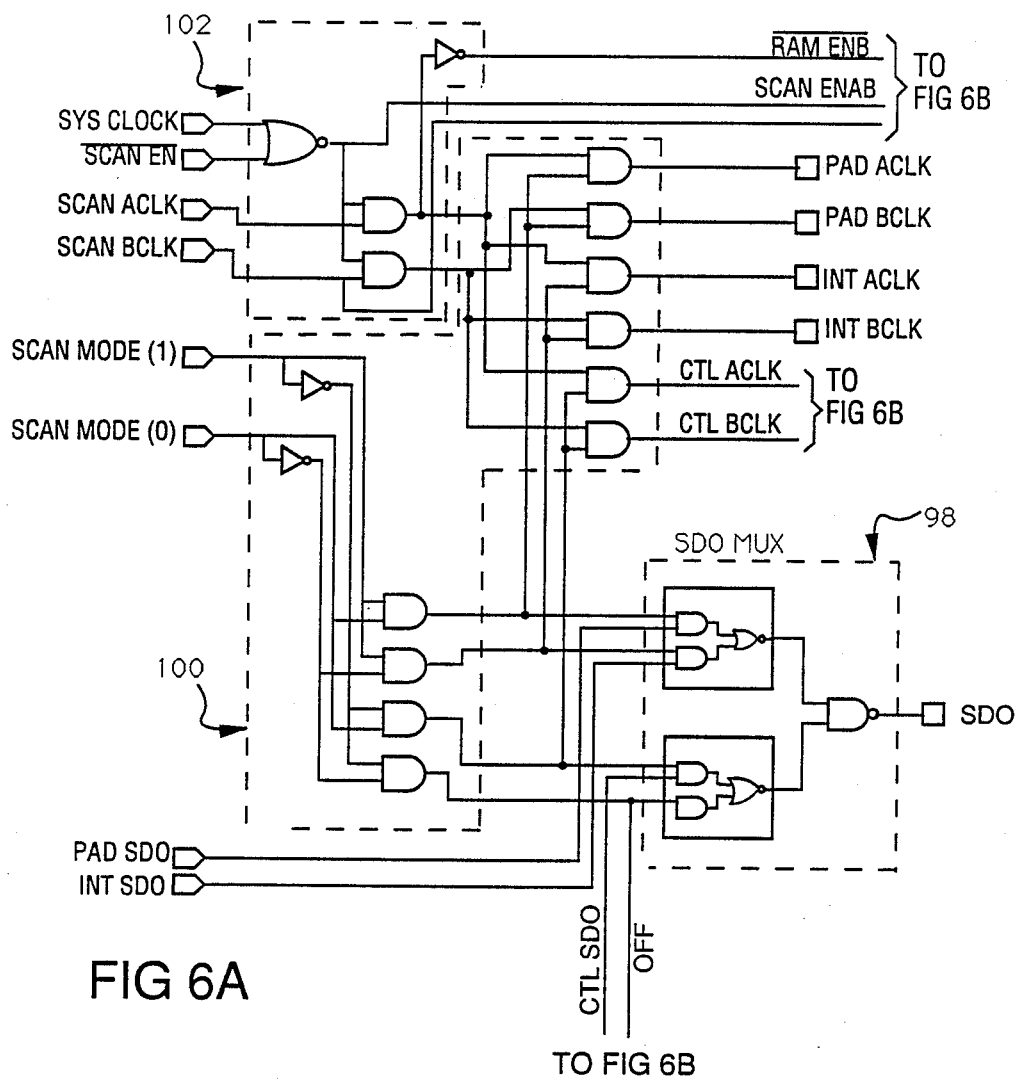
FIGS. 6A and 6B are a schematic and block diagram of another section of the integrated circuit of FIGS. 3A and 3B.
Figure 6B:
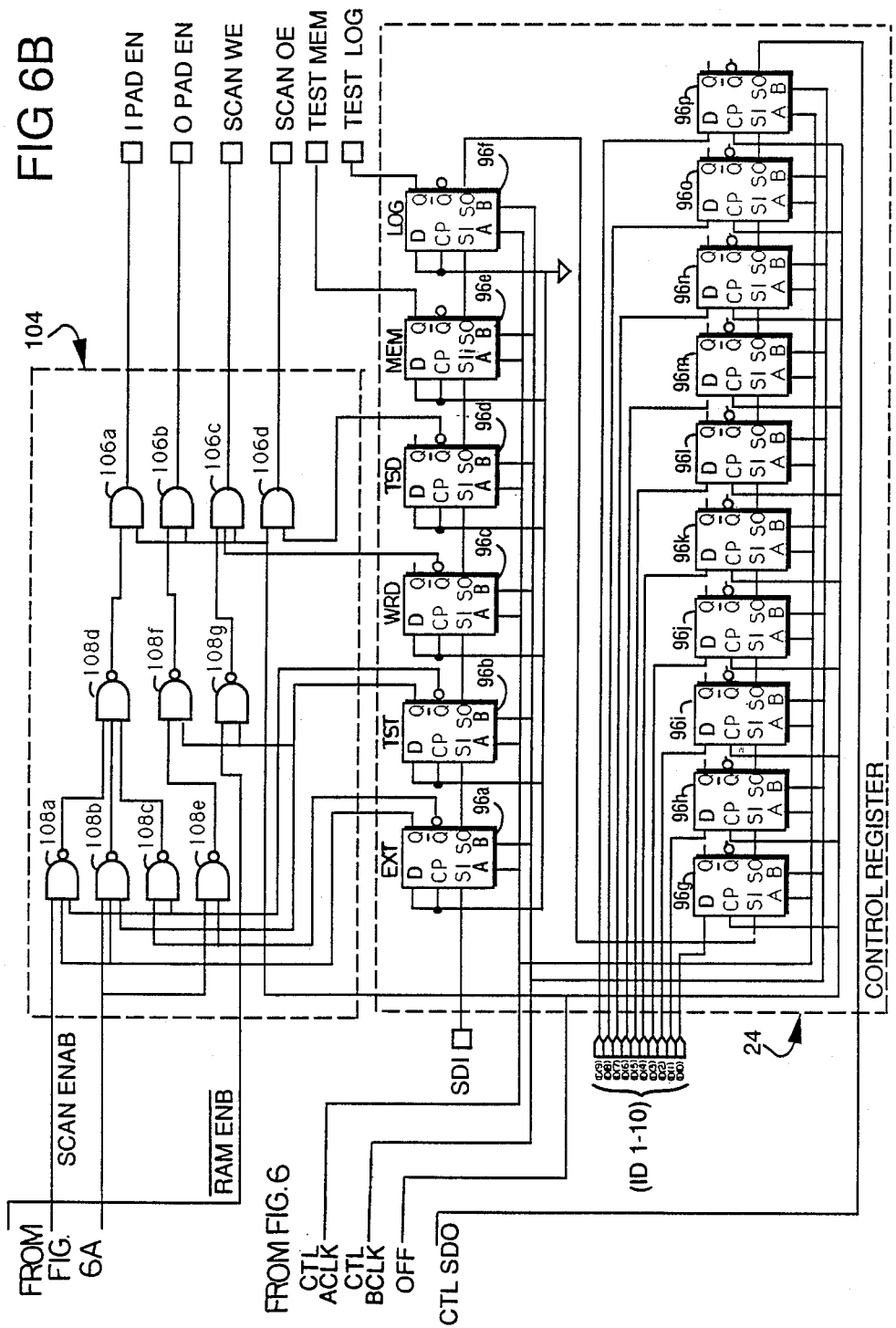

Referring to FIGS. 6A and 6B, scan control section 18 includes control register scan chain 24 (FIG. 1), which is a 16-bit scannable shift register comprising six configuration elements 96a-96f and ten integrated circuit identification elements 96g-96p. Each element 96a-96p is identical to element 48a of FIG. 4. The D and CP ports of elements 96a-96f are connected to ground potential, and thus these elements are always "closed" (because CP is a logic low) and operable as shift registers in response to clock signals (CTL ACLK, CTL BCLK) applied to their A and B ports, respectively. Elements 96g-96p are programmable (via their CP ports) to "capture" data applied to their D ports (in the manner discussed above) and operate as shift registers in response to the CTL ACLK, CTL BCLK signals for purposes to be discussed.

The D port of each element 96g-96p receives a bit of a 10 bit identification code (ID 1-10) which is unique for each integrated circuit 14a-14m on each PCB 12a-12n. The 10 identification bits of integrated circuit 14a are all hard-wired to logic 0 states (FIGS. 3A and 3B). The SI and SO ports of elements 96a-96p are chained together to provide a serial shift register, the serial data input of which is applied to the SI port of element 96a via the SDI port of scan control block 18. The serial data output of control register scan chain 24 (CTL SDO) is taken at the SO port of element 96p and applied to SDO multiplexer 98 along with the serial data outputs of pad ring scan chain 20 (via the PAD SDO output port of scan control section 18) and asic internal scan chain 22 (via the asic's INT SDO output port). SDO mux 98 is controlled by the SCAN MODE 1, SCAN MODE 0 signals from system scan controller 26 (via lines 27c, 27d—FIG. 1) to selectively couple the serial data output of scan chain 20, 22, or 24 to the integrated circuit's SDO pad 42.

Scan control section 18 also includes scan clock decoder 100 which selectively distributes the pair of nonoverlapping scan clocks SCAN ACLK, SCAN BCLK to pad ring scan chain 20 (as PAD ACLK, PAD BCLK), asic internal scan chain 22 (as INT ACLK, INT BCLK), or control register scan chain 24 (as CTL ACLK, CTL BCLK) in accordance with the SCAN MODE 1 and SCAN MODE 0 signals. The scan clocks are applied to scan control section 18 from system scan controller 26 (via lines 27a, 27b—FIG. 1) and are coupled to scan clock decoder 100 via scan enabling circuit 102. Scan enabling circuit 102 gates SCAN ACLK and SCAN BCLK signals to decoder 100 selectively in accordance with the system clock (SYS CLOCK) and the $\overline{\text{SCAN EN}}$ signal from PCB scan controller 32 on the associated one of lines 35a-35m—(FIG. 2). Scan enable circuit 102 prevents SCAN ACLK and SCAN BCLK from being applied to decoder 100 unless both SYS CLOCK and $\overline{\text{SCAN EN}}$ are low, as discussed in detail below.

The SCAN MODE [1:0] (i.e., SCAN MODE 1, SCAN MODE 0) signals control the operating mode of the integrated circuits 14a-14m on every PCB 12a-12n. When the signals have a combined binary value of 0, integrated circuits 14a-14m are in the normal operating mode and are clocked by the SYS CLOCK signal. None of chains 20, 22, 24 in any integrated circuit 14a-14m is scannable, even if $\overline{\text{SCAN EN}}$ and SYS CLOCK both go low, because decoder 100 prevents the SCAN ACLK and SCAN BCLK signals from being applied to any of the scan chains 20, 22, 24.

Referring also to FIGS. 1 and 2, a scan chain 20, 22, 24 of a given integrated circuit 14a-14m on a given PCB 12a-12n is scannable when the value of SCAN MODE [1:0] is either a 1, 2, or 3, provided that SYS CLOCK and the unique $\overline{\text{SCAN EN}}$ signal for that integrated circuit are both low. The $\overline{\text{SCAN EN}}$ signal will be a logic low only if system scan controller 26 has selected (via the PCB ADDR on bus 25—FIG. 1) the particular PCB 12a-12n on which the integrated circuit is located and has selected (via the IC ADDR on bus 27g FIG. 1) the particular integrated circuit 14a-14m. When SCAN MODE [1:0] equals 1 (i.e., 0,1), control register scan chain 24 is scannable. SCAN ACLK and SCAN BCLK are pulsed as a pair by system scan controller 26 to serially shift data through latches 96a-96p by one bit (via the CTL ACLK, CTL BCLK signals, respectively). The serial data output of scan chain 24 (CTL SDO) is coupled to the integrated circuit's SDO pad 42 by multiplexer 98, and from there to the SDO input of system scan controller 26 via muxes 36 and 30.

The internal scan chain 22 of asic 16 is scannable in the same fashion when SCAN MODE [1:0] equals 2 (i.e., 1,0), with scan chain 22 being shifted by one bit on each occurrence of a SCAN ACLK, SCAN BCLK pulse pair (applied to scan chain 22 via the INT ACLK, INT BCLK outputs of decoder 100). Multiplexer 98 couples the serial data output of scan chain 22 (INT SDO) to SDO pad 42.

When SCAN MODE [1:0] equals 3 (i.e., 1,1), pad ring scan chain 20 is scannable. Pad ring 20 likewise is serially shifted by one bit upon each occurrence of a SCAN ACLK, SCAN BCLK pulse pair, which is applied to scan chain 20 via the PAD ACLK, PAD BCLK outputs, respectively, of decoder 100. The serial data output of scan chain 20 (PAD SDO) is coupled to SDO pad 42 by multiplexer 98.

Referring also to FIG. 5, scan control section 18 additionally includes scan protection circuit 104 for protecting other integrated circuits 14a–14m (on each PCB 12a–12n) from damage during scanning, and for preventing the scanning of any scan chain 20, 22, 24 from inadvertently causing unwanted data to be written into asic memory 76 (e.g., RAM or register files). During any scan mode (i.e., when SCAN MODE [1:0] equals 1, 2, or 3), decoder 100 de-asserts (i.e. to a logic low) an "OFF" control signal, which disables AND gates 106a, 106b, 106c, 106d in protection circuit 104, forcing the outputs thereof to logic low states. The output of AND gate 106a is the I PAD EN control signal for the CP ports of pad ring 20 input elements 48a–48d (FIG. 4). When the I PAD EN signal is low, transmission gate 60a (FIG. 4) in each element 48a–48d is "OFF", thereby isolating inputs A–D of asic 16 from corresponding integrated circuit input pads 38 and I/O pad 46. Similarly, the output of AND gate 106b is applied to the CP ports of pad ring 20 output elements 48e–48i as the O PAD EN control signal, which, when low, closes elements 48e–48i to isolate corresponding output pads 42 and I/O pad 46 from outputs A–D and TS EN of asic 16.

The output of AND gate 106c provides a SCAN WE control signal, which is applied to NAND gate 90 in asic 16. When SCAN WE is a logic low, NAND gate 90 prevents the $\overline{WE}$ input of asic memory 76 from being enabled (i.e., prevents a logic low from being applied to the $\overline{WE}$ input). Stated alternately, no RAM or register file in any integrated circuit 14a–14m on any PCB 12a–12n may be written into when any scan chain 20, 22, 24 anywhere in system 10 is being scanned. This insures that an integrated circuit's memory 76 will not accidently be written into during scanning.

The output of AND gate 106d provides a SCAN OE control signal which controls tri-state output drivers 45 (FIGS. 3A and 3B). When SCAN OE is a logic low, drivers 45 are disabled. Thus, during scanning of any scan chain 20, 22, 24 in any integrated circuit 14a–14m in system 10, no integrated circuit is permitted to drive tri-state buses. This prevents possibly damaging tri-state bus fights between two or more integrated circuits, or between an integrated circuit and an external testing device, from inadvertently occurring during scanning.

Protection circuit 104 also controls the logic states of the I PAD EN, O PAD EN, SCAN WE, and SCAN OE control signals selectively in response to signals produced by scan enable circuit 102 and by configuration elements 96a–96f during the normal operating (i.e., non-scanned) mode of the integrated circuit (i.e., when SCAN MODE [1:0] equals 0). Scan enable circuit 102 applies a logic high SCAN ENAB signal and a $\overline{RAM\ ENB}$ signal (the complement of SCAN ACLK) to protection circuit 104 when both SYS CLOCK and $\overline{SCAN\ EN}$ are low, while SCAN BCLK is applied directly to protection circuit 104, for purposes to be discussed.

Configuration elements 96a–96f contain six control bits (loaded serially by scanning the bits into scan chain 24) which determine the configuration of the individual integrated circuit 14a–14m for operation, scanning, or testing. The configuration bits are as follows:

TST (test mode, latch 96b)—this bit is set to isolate asic 16 from the input pads 38 fed by inputs A–D, the output pads 42 for outputs A–D and TS EN, and I/O pad 46, by resetting (i.e. to a logic low) the I PAD EN and O PAD EN control signals via NAND gates 108a–108d, 108f. This allows an asic 16 in a particular integrated circuit 14a–14m to be tested with the integrated circuit in place on its printed circuit board 12a–12n (and the PCB in place in system 10). A set TST bit also inhibits writing into the asic memory 76 of the particular integrated circuit by resetting the SCAN WE control signal of that integrated circuit via NAND gate 108g.

EXT (external test mode, latch 96a) with SCAN MODE [1:0] equal to 0 and TST set, the EXT bit determines which portion of the integrated circuit's pad ring scan chain 20 can be strobed by SCAN BCLK. When EXT is a logic low, the O PAD EN control signal at the CP ports of output elements 48e–48i is driven by SCAN BCLK (via gates 108e, 108f). Referring to FIG. 3, when SCAN BCLK is pulsed, the signal at the D input of each pad ring output element 48e–48i is "captured" and latched into the slave latch 52 thereof, and the outputs of asic 16 are isolated from pads 42, 46. This is useful for testing circuitry within (i.e., internal to) asic 16. On the other hand, when EXT is set (i.e. to a logic high), SCAN BCLK drives the I PAD EN control signal applied to the CP ports of input pad ring elements 48a–48d (via gates 108b, 108d). Thus, pulsing SCAN BCLK latches the D inputs of pad ring input elements 48a–48d into slave latches 52 thereof and isolates the inputs of asic 16 from input pads 38. This "captures" signals applied to those pads 38 from circuitry external to the integrated circuit, allowing the integrated circuit to be used to test such external circuitry.

TSD (tri-state disable, latch 96d)—this bit is set (at a logic 0) to clear the SCAN OE signal via AND gate 106d, thereby disabling tri-state buffers 45. This inhibits tri-state operation of the particular integrated circuit.

WRD (write disable, latch 96c)—this bit is set (at a logic 0) to clear the SCAN WE signal (via AND gate 106c) and prevent $\overline{RAM\ ENB}$ (from scan enable circuit 102) from enabling writing into asic memory 76 of the particular integrated circuit. Asic memory 76 is written into (when SCAN MODE [1:0] equals 0) by clearing WRD and $\overline{SCAN\ EN}$, setting TST, and pulsing $\overline{RAM\ ENB}$ by pulsing SCAN ACLK.

LOG (test combinatorial logic, latch 96f)—this bit, when set, asserts the TEST LOG control signal, which switches multiplexer 86 (FIG. 5) in asic 16 to apply the contents of test register 74b to the functional logic 70b following memory 76. This allows logic 70b to be tested with known input signals previously scanned into register 74b, as discussed above.

MEM (test memory elements, latch 96e)—this bit is set to apply a logic high TEST MEM signal to multiplexers 82, 84 to decouple the data, address, and $\overline{WE}$ inputs of memory 76 from functional logic 70a and couple such inputs to asic input ports 78. TEST MEM, when set, also couples the data outputs of memory 76 (available via mux 86) to asic output ports 80 through mux 94 in place of the outputs of functional logic 70. This allows memory 76 to be written and/or read directly via pads 78, 80.

It is noted, regarding control signals I PAD EN, O PAD EN, SCAN WE, SCAN OE, that the configuration elements 96a–96f in a given integrated circuit 14a–14m allow personalization of the logic states of such signals for the individual integrated circuit. By contrast, the configured states of all of these control signals of every integrated circuit 14a–14m on every PCB 12a–12n are overriden and reset to a logic 0 whenever any scan chain 20, 22, 24 anywhere in system 10 is being scanned (i.e., when SCAN MODE [1:0] is other than 0).

Figure 7:
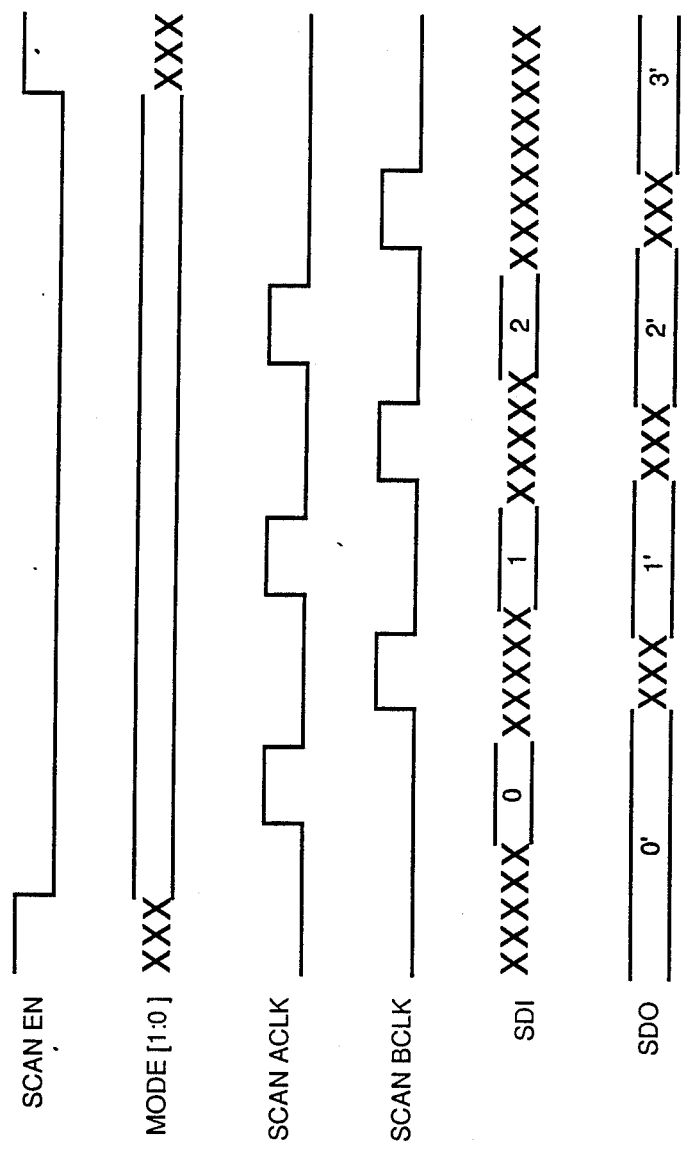
FIG. 7 is a timing diagram useful in understanding scanning the integrated circuit of FIGS. 3A and 3B.

Referring also to FIGS. 1, 2, and 7, in operation, data is serially shifted into (and out of) a selected scan chain 20, 22, 24 (i.e., the chain is scanned) in the following manner. First, system scan controller 26 selects the printed circuit board 12a–12n (for example, PCB 12a) and integrated circuit 14a–14n (for example, IC 14a) to be scanned via the PCB ADDR signal (on bus 25) and the IC ADDR signal (on bus 27g). This places the SCAN EN signal applied (via line 35a) to integrated circuit 14a on PCB 12a to a logic low state (FIG. 6). System scan controller 26 also sets SYS CLOCK low (line 27f). Thus, scan enable circuit 102 in IC 14a allows the scan clocks to be coupled to one of the scan chains 20, 22, 24 via decoder 100. System scan controller 26 selects the scan chain with the SCAN MODE [1:0] signals: setting the signals equal to 1 (0,1) selects control register 24 for scanning; a setting of 2 (1,0) selects asic internal scan chain 22 for scanning; and a setting of 3 (1,1) enables scanning of pad ring scan chain 20. With any scan chain 20, 22, 24 selected, the OFF signal produced by decoder 100 "closes" pad ring scan chain 20 in integrated circuit 14a by resetting I PAD EN and O PAD EN. The pad ring scan chains 20 of all other integrated circuits in system 10 are also closed, because the OFF control signals produced in the integrated circuits are also reset whenever any scan chain 20, 22, 24 is being scanned (because SCAN MODE [1:0] is other than zero). The selected scan chain 20, 22, 24 is scanned by system scan controller 26 alternately pulsing SCAN ACLK, SCAN BCLK and producing a data bit at its SDI port (line 27e) on the occurrence of each SCAN ACLK. Clock decoder 100 applies the scan clocks to the scan chain selected by the SCAN MODE [1:0] signals, and each SCAN ACLK, SCAN BCLK pulse pair will shift the selected scan chain by one bit.

For example, loading an alternating stream of logic 1 and logic 0 bits into pad ring scan chain 20 requires 9 pairs of SCAN ACLK, SCAN BCLK (i.e., PAD ACLK, PAD BCLK) pulses. Upon the first SCAN ACLK pulse, system scan controller 26 produces a logic 1 signal at its SDI port. The logic 1 bit enters master latch 50 of pad ring element 48a when SCAN ACLK is high and is loaded into the master latch when SCAN ACLK pulse 72a returns to a logic low. The logic 1 bit enters slave latch 52 when the SCAN BCLK pulse becomes a logic high and is loaded therein after the SCAN BCLK pulse returns to a logic low. This process continues for eight more SCAN ACLK, SCAN BCLK pulse pairs, with the first loaded bit ending up in pad ring element 48i.

Data in a selected scan chain (e.g., pad ring scan chain 20) is shifted out of the chain to system scan controller 26 at the same time that data is being shifted into the chain. Upon the first SCAN ACLK, SCAN BCLK pulse pair a PAD ACLK, PAD BCLK pulse pair is applied to pad ring latches 48a–48i, shifting the bits in each latch 48a–48i to the next latch. Thus, the bit in slave latch 52 of element 48i is shifted to SDO mux 98 in scan control section 18 as PAD SDO. SDO mux 98, in response to the SCAN MODE [1:0] signal (equal to 3), couples the bit to SDO port 42 of IC 14a, where it is coupled via muxes 36, 30 to system scan controller 26. This process continues for a total of nine SCAN ACLK, SCAN BCLK pulse pairs, until the bit initially in element 48a is shifted into system scan controller 26.

Data is shifted through scan chains 22, 24 of selected integrated circuit 14a in much the same way. For example, general register 72a and test register 74b are serially loaded with stimulus data to test functional circuitry 70a, 70b, respectively, by setting SCAN MODE [1:0] equal to 2 and serially shifting data from system scan controller 26 into internal scan chain 22 with SCAN ACLK, SCAN BCLK pulse pairs, which are applied to scan chain 22 register as INT ACLK, INT BCLK pulse pairs. The registers are loaded in reverse: from general register 72e to general register 72d, and so on until general register 72a is loaded. Similarly, response data produced by functional circuitry 70a, 70b during one or more normal operating cycles (i.e., in response to one or more SYS CLOCK pulses) and loaded in registers 74a, 72e, respectively, is serially shifted to system scan controller 26 simply by selecting scan chain 22 (SCAN MODE [1:0]=2) and alternately pulsing SCAN ACLK, SCAN BCLK a sufficient number of times to shift the data through registers 72a, 72b, 74a, 72c, 74b, 72d, and 72e to system scan controller 26.

Likewise, configuration elements 96a–96f are serially loaded by selecting scan chain 24 (i.e., by setting SCAN MODE [1:0] equal to 1) and producing 16 SCAN ACLK, SCAN BCLK pulse pairs, which are applied to latches 96a–96p as CTL ACLK, CTL BCLK pulse pairs. Control register elements 96a–96p are loaded in reverse order, with the EXT bit being loaded in latch 96a on the 16th SCAN ACLK SCAN BCLK pulse pair.

During normal operation of system 10, logic 0 states are present in the EXT, TST, WRD, TSD, MEM, and LOG configuration elements 96a–96f of all integrated circuits, such logic states having previously been scanned into elements 96a–96f in the manner discussed above, and system scan controller 26 sets SCAN MODE [1:0] equal to 0. Thus, no scan chains 20, 22, 24 are scannable, even if SYS CLOCK and the SCAN EN signal applied to a given integrated circuit are both low. The I PAD EN, O PAD EN control signals applied to the CP ports of elements 48a–48i in the pad rings 20 in all integrated circuits are logic high signals; thus all pad rings 20 are "open". That is, elements 48a–48i all couple signals from their D inputs to their Q, $\overline{Q}$ outputs. Also, memory 76 and general registers 72a–72e (FIG. 5) in each asic 16 operate normally within functional circuitry 70 in response to SYS CLOCK, and muxes 82, 84, 86, 94 all couple signals in asic 16 along their normal signal paths (i.e., the "A" inputs of the muxes are selected). Thus, scan chains 20, 22, 24 are transparent in system 10 during normal operation.

Each integrated circuit 14a–14m in system 10 can be placed into one of three test modes by shifting various combinations of logic states into its TST and EXT configuration registers 96b, 96a in the manner discussed above and then setting SCAN MODE [1:0] equal to 0. The three test modes are the "parallel", "internal", and "external" test modes.

In the parallel test mode, used when testing a single integrated circuit 14a–14m on an IC tester (such as a dedicated asic tester manufactured by Ando Corp. of Japan), TST is reset (logic low) and EXT set. In this mode, output elements 48e–48i of pad ring 20 are always open (coupling the outputs of asic 16 to associated pads 42, 46 and to the tester) because O PAD EN is maintained at a logic high (due to the logic low state of the TST bit). Input elements 48a–48d are selectively strobed in accordance with the logic state of $\overline{\text{SCAN EN}}$ (which is coupled as SCAN ENAB (FIG. 6) through gates 108a, 108d, 106a to the CP ports of elements 48a–48d as the I $\overline{\text{PAD EN}}$ signal). Elements 48a–48d are closed when $\overline{\text{SCAN EN}}$ is a logic high (making I $\overline{\text{PAD EN}}$ a logic low) and opened when $\overline{\text{SCAN EN}}$ is a logic low.

In the parallel test mode, input signals from the tester (i.e., a stimulus vector), appearing as inputs A–D on integrated circuit input pads 38 and I/O pad 46, are captured by latching these signals into the slave latches 52 (FIG. 4) of input pad ring elements 48a–48d with a single $\overline{\text{SCAN EN}}$ pulse. This is done to avoid the need for the tester to continually apply the stimulus vector during the test. The tester then advances the internal state of asic 16 (by applying SYS CLOCK). The resultant output signals generated by asic 16 are coupled through open pad ring output elements 48e–48i and detected by the tester. Another reason for capturing the stimulus vector in input pad ring elements 48a–48d and allowing the tester to remove the stimulus vector is that often a test signal is applied to I/O pad 46 as an input for asic 16. After the asic's internal state is advanced, however, asic 16 may drive the I/O pad with an output signal. A tri-state bus fight would ensue with the tester if the tester was still driving the I/O pad with the input signal, possibly damaging asic 16 or the tester.

An integrated circuit (e.g., IC 14a) is placed in the internal test mode by setting the TST configuration bit and resetting the EXT bit. In this mode, asic 16 of IC 14a may be fully tested with IC 14a in place on printed circuit board 12a and with PCB 12a in place in system 10 without interference from (or interfering with) the operation of other integrated circuits or PCBs. Input elements 48a–48d of pad ring 20 are closed during the internal test made, isolating inputs A–D of asic 16 from corresponding input pads 38 and I/O pad 46 and allowing test data to be serially shifted into input elements 48a–48d from the SDI output of system can controller 26 and applied as a test word to asic inputs A–D. Output pad ring elements 48e–48i are selectively strobed by SCAN BCLK. Elements 48e–48i are closed when SCAN BCLK is a logic low (isolating asic outputs A–D, TS EN from corresponding pads 42, 46) and momentarily opened to latch asic outputs A–D, TS EN into slave latches 52 (FIG. 4) thereof when SCAN BCLK is pulsed. Thus, the outputs generated by asic 16 in response to the test word applied by latches 48a–48d are captured for subsequent serial shifting out of latches 48e–48i in the manner discussed above.

In the external test mode, both the EXT and TST configuration bits are set. In this mode, the integrated circuit (e.g., IC 14a) provides a means of testing other integrated circuits in system 10. In the external test mode, output pad ring elements 48e–48i of IC 14a are always closed, isolating outputs A–D, TS EN of asic 16 from corresponding pads 42, 46. Test data is serially shifted into output elements 48e–48i in the manner described above for use as a test word for testing circuitry external to integrated circuit 14a via output pads 42, 46. Input pad ring elements 48a–48d are strobed by pulsing SCAN BCLK (which is applied thereto via gates 108b, 108d, 106a as I $\overline{\text{PAD EN}}$) to latch signals applied as inputs A–D to pads 38, 46 of integrated circuit 14a by the external circuitry in response to the test word. The latched signals are then shifted out of pad ring 20 to system scan controller 26 in the manner discussed above. It is important to note that SCAN BCLK is applied directly to gate 108b of scan protection circuit 104 (FIGS. 6A and 6B), rather than through scan enable circuit 102. This avoids introducing possibly unequal delays in applying SCAN BCLK to more than one integrated circuit 14a–14m in the external test made.

Referring again to FIGS. 5 and 6A and 6B, during normal operation the TST and WRD configuration bits in each integrated circuit 14a–14m in system 10 are reset (i.e., to a logic high), as discussed above, thereby setting the SCAN WE control signal and allowing asic memory 76 to be written in accordance with signals from functional circuitry 70a. During any scan mode, however, (i.e., when SCAN MODE [1:0] is other than 0) the state of the OFF signal produced by decoder 100 is a logic low, resetting SCAN WE and preventing memory 76 from being written into. Specifically, the logic low SCAN WE control signal prevents NAND gate 90 in asic 16 from coupling a write enable signal to memory 76. Asic memory 76 is alternatively prevented from being written by setting the WRD configuration bit (latch 96c). This resets the SCAN WE control signal, preventing writing into memory 76, regardless of whether system 10 is in the normal mode or a scan mode.

Asic memory 76 in a given integrated circuit (e.g., IC 14a on PCB 12a) is tested by setting SCAN MODE [1:0] equal to 0, resetting the WRD configuration bit (latch 96c) and setting the TST bit (latch 96b) of IC 14a. In the test mode, the state of the SCAN WE control signal equals the complement of SCAN ACLK ($\overline{\text{RAM ENB}}$), but only if $\overline{\text{SCAN EN}}$ for IC 14a is a logic low (if a logic high, $\overline{\text{RAM ENB}}$ is disabled by scan enable circuit 102) and only if the normal write enable signal associated with memory 76 (i.e. the other input of NAND gate 90) is asserted. Thus, asic memory 76 is writable when SCAN ACLK is a logic high, and not writable otherwise.

The tri-state output buffers 45 of all integrated circuits 14a–14m in system 10 are disabled during any scan mode, because the logic low OFF signal produced when SCAN MODE [1:0] is other than 0 forces SCAN OE to a logic low. In addition, the tri-state buffers 45 of an individual integrated circuit (e.g., IC 14a on PCB 12a) are disabled, independently of scanning, by setting the TSD configuration bit (latch 96d) of that individual IC 14a. This forces SCAN OE to a logic low state. Normal operation of tri-state buffers 45 (under the control of asic functional output TS EN) occurs only when SCAN MODE [1:0] equals 0 and TSD is reset.

Thus, scan control sections 18 of all integrated circuits in system 10, via their SCAN WE and SCAN OE outputs, prevent asic memory 76 from being written into and tri-state outputs from being enabled whenever SCAN MODE [1:0] is not equal to zero. This prevents inadvertent RAM and register file writes and tri-state bus fights from occurring when any scan chain anywhere in system 10 is being shifted. That is, because SCAN MODE [1:0] is distributed to every integrated circuit 14a–14m in every PCB 12a–12n, no asic RAM or register file can be written into and no tri-state outputs can be enabled anywhere in system 10 if any scan chain 20, 22, 24 of any integrated circuit is being scanned. In addition, memory write disable and/or tri-state disable can be personalized for individual integrated circuits, simply by setting the WRD and/or TSD configuration bits of that integrated circuit. For example, setting WRD in integrated circuit 14a on PCB 12a prevents asic memory 76 in that integrated circuit from being written even if SCAN MODE [1:0] equals zero.

EXAMPLES

Figure 8:
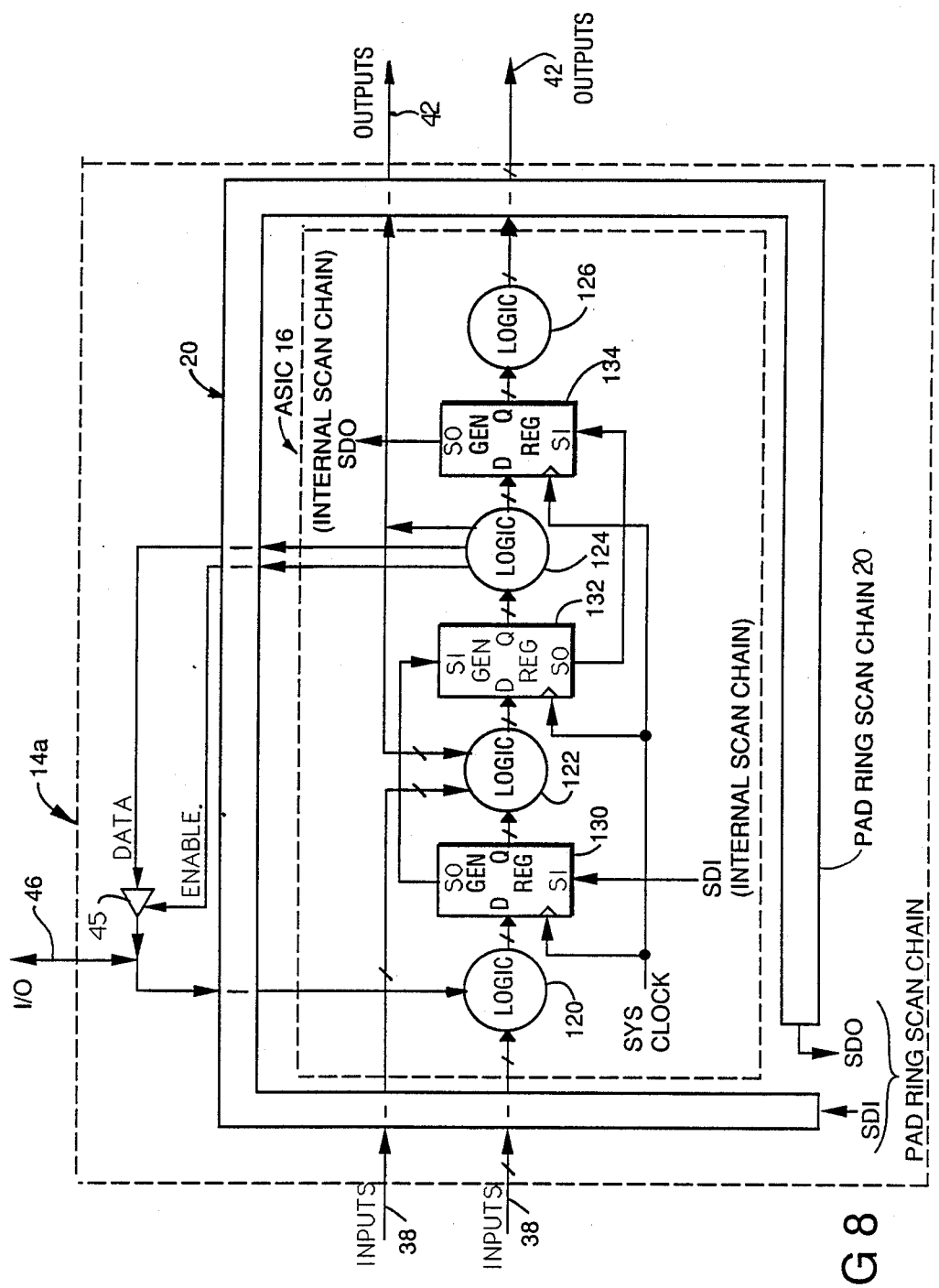
FIG. 8 is a schematic and block diagram of the integrated circuit of FIGS. 3A and 3B useful in understanding the procedures of FIGS. 9–15.

Referring to FIG. 8, representative integrated circuit 14a is redrawn to aid in understanding the examples discussed below. As shown, asic 16 includes combinational logic networks 120, 122, 124, 126 interspersed between general registers 130, 132, 134. Logic networks 120 126 and general registers 130–134 are a part of asic functional circuitry 70 (FIG. 5), and general registers 130, 132, 134 are part of internal scan chain 22. As shown, logic networks 120, 122 can be stimulated directly via input pads 38, 46 or pad ring scan chain 20 (i.e., by input pad ring elements 48a–48d—FIGS. 3A and 3B). However, logic networks 124, 126 receive their inputs from general registers 132, 134. Moreover, only logic networks 122, 124, 126 provide direct outputs to pads 42, 46, via pad ring scan chain 20 (i.e., via output elements 48e–48i). The outputs of logic network 120 (as well as a portion of the outputs of logic networks 122, 124) are applied to general registers.

Thus, in general, logic networks 120–126 are tested by scanning an internal stimulus (i.e., test) vector into general registers 130–134. This provides test inputs for logic networks 122, 124, 126. Then, an external stimulus vector is applied to the primary inputs (FIGS. 3A and 3B) of asic 16 to provide test inputs for logic networks 120, 122. This is done either directly from pads 38, 46 (when testing IC 14a individually on a tester), or by scanning the external stimulus vector into input elements 48a–48d (FIGS. 3A and 3B) of pad ring scan chain 20 (when testing IC 14a in place in system 10).

Then, the signals produced at the primary outputs (FIGS. 3A and 3B) of asic 16 in response to the stimulus vectors are captured. This is also done either directly at pads 42, 46 by an IC tester or by latching the outputs into output elements 48e–48i (FIGS. 3A and 3B) of pad ring scan chain 20 (when testing IC 14a in place in system 10).

Next, the internal state of asic 16 is advanced by pulsing SYS CLOCK one or more times to load outputs from logic networks 120, 122, 124 based on the stimulus vectors into general registers 130, 132, 134. Then, this result data is scanned out of registers 130–134 by scanning internal scan chain 22. If asic primary outputs were captured in output elements 48e–48i, pad ring scan chain 20 is scanned to retrieve that result data.

Figure 9:
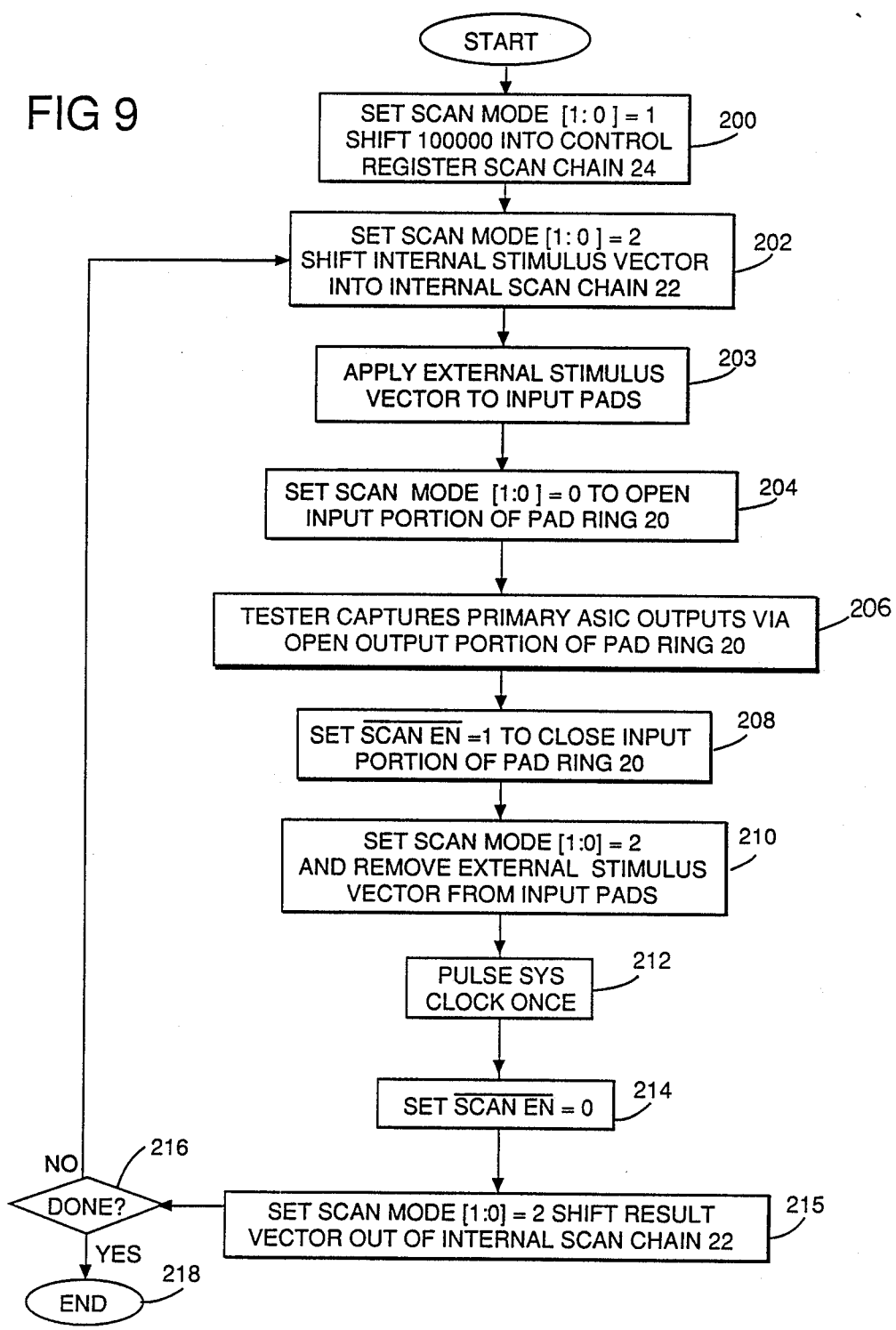
FIGS. 9–11 are flow charts for testing and initializing the integrated circuit of FIGS. 3A and 3B on an IC tester.
Figure 10:
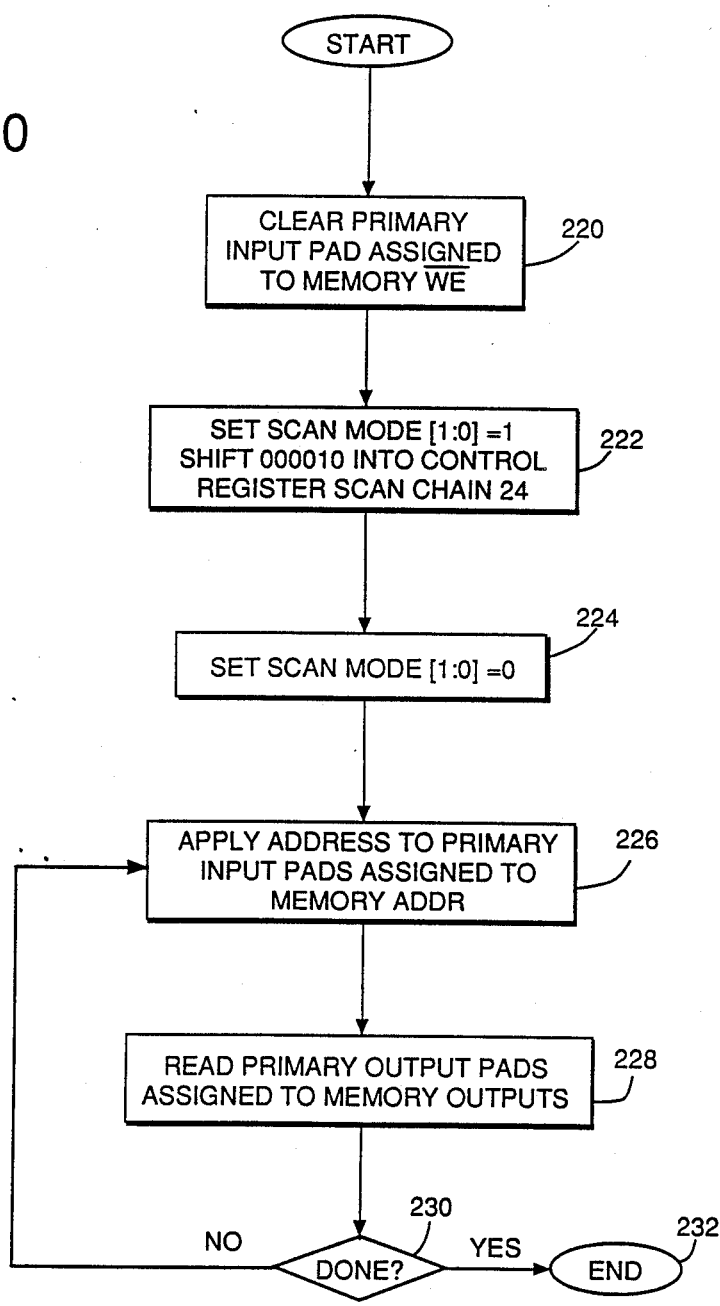
Figure 11:
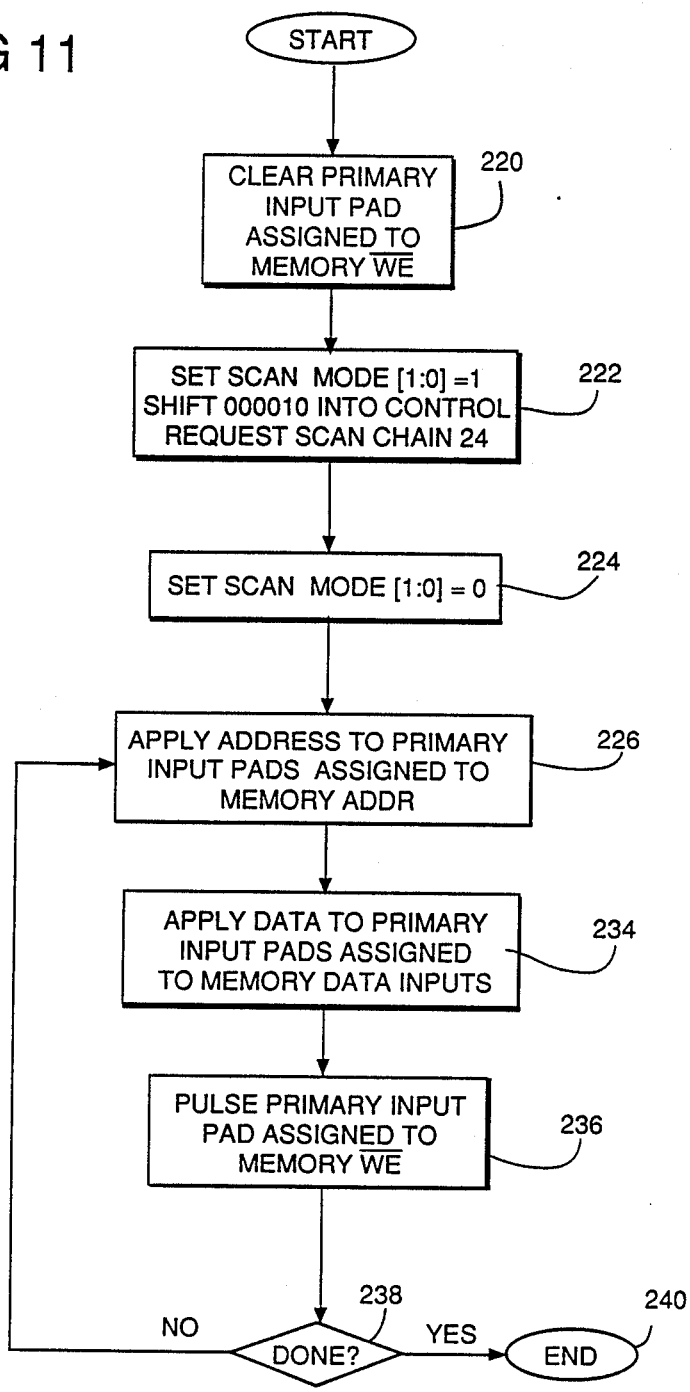

Referring also to FIGS. 9–11, shown are procedural flow charts for testing an individual integrated circuit 14a on the IC tester (i.e. apart from the printed circuit board) in accordance with the general procedure discussed above. Except where otherwise noted, SYS CLOCK, SCAN ACLK, SCAN BCLK and $\overline{\text{SCAN EN}}$ are all logic low.

Referring to FIG. 9, stimulus vectors (i.e. test words) are applied to integrated circuit 14a by first setting SCAN MODE [1:0] equal to 1 and shifting 100000 into elements 96a–96f of control register scan chain 24 (200). This sets the EXT configuration bit (element 96a) and clears the remaining bits. SCAN MODE [1:0] is then set to 2; and the internal stimulus vector is shifted into internal scan chain 22 (202).

The external stimulus vector is applied as inputs A–D to corresponding pads 38, 46 of IC 14a (203). SCAN MODE [1:0] is then set to 0 (placing IC 14a in the parallel test mode) to open pad ring 20 and apply the external stimulus vector to asic 16 (204). The primary asic outputs A–D are then captured by the tester by simply observing the outputs of corresponding pads 42, 46 (206). The input portion of pad ring 20 (i.e. latches 48a–48d) is then closed by setting $\overline{\text{SCAN EN}}$ to a logic one (208). This latches the external stimulus vector into latches 48a–48d.

SCAN MODE [1:0] is set equal to 2 (210), inhibiting tri-state buffers 45 (by resetting the OFF control signal) to prevent the buffer 45 connected to I/O pad 46 from being enabled as a result of the next step (212). Also, the external stimulus vector is removed from pads 38, 46 by the tester. These steps avoid a possibly damaging tri-state bus fight with the IC tester.

Next, the internal state of asic 16 is advanced by pulsing SYS CLOCK once (212). When SYS CLOCK has returned to a logic low, $\overline{\text{SCAN EN}}$ is set to a logic low (214) to enable subsequent scanning of internal scan chain 22. Input pad ring latches 48a–48d remain closed, because SCAN MODE [1:0] is other than 0. Then, SCAN MODE [1:0] is set equal to 2 and the result vector generated by functional circuitry 70 in response to the internal and external stimulus vectors is shifted out of internal scan chain 22 (215). The result vector and primary asic outputs are compared to those which were expected from the stimulus vectors to determine if the tested functional circuitry of asic 16 is functioning properly. If all of the required test vectors have been applied (216), the test sequence is concluded (218). If not, the procedure returns to step 202 and continues.

Referring to FIG. 10, asic memory 76 is (e.g., RAM and/or register files) read on the IC tester in accordance with the following procedure. The primary input pad 78 of integrated circuit 14a which is connected to the write enable input of memory 76 (i.e. the pad connected to input B of mux 84—FIG. 5) is cleared (220). SCAN MODE [1:0] then is set equal to 1 and 000010 shifted into control register scan chain 24 (222). This sets the MEM configuration bit (element 96e), thereby setting the TEST MEM control signal and causing muxes 82, 84 to couple pads 78 of integrated circuit 14a (i.e. inputs "B" of muxes 82, 84) to the ADDR, data, and $\overline{\text{WE}}$ inputs of memory 76, and causing multiplexer 94 to couple the data outputs of memory 76 to output pads 80. Then, SCAN MODE [1:0] is set to zero to open pad ring latches 48a–48i (224).

A predetermined memory address is then applied to the pads 78 of integrated circuit 14a multiplexed to the memory address inputs (226). That address is read (228) and the output data are coupled to primary output pads 80 via muxes 86, 94 and captured by the tester via open pad ring 20. If all of the required addresses have been read (230), the test procedure is complete (232). If not, the procedure returns to step 226 and a new address is entered.

Referring to FIG. 11, the procedure for writing into asic memory 76 utilizes the first four steps (220, 222, 224, 226) of FIG. 10 and thus these steps are identified by the same reference numerals and are not described further. After the memory address is applied to pads 78, a predetermined data word is applied (234) to the primary input pads 78 which are multiplexed (via multiplexer 82) to the data inputs of memory 76. Then, the primary input pad assigned to the memory's write enable input (via mux 84) is pulsed, thereby writing the data input into the memory address selected in step (226). If all required addresses have been written (238), the procedure is complete (240); if not, steps 226–236 are repeated for a new address and input data.

Referring to FIGS. 12-15, flow charts are shown for similar procedures performed on a selected integrated circuit 14a-14m on a selected PCB 12a-12n installed in system 10. The integrated circuit is selected by the PCB ADDR and IC ADDR from system scan controller 26, as discussed above, thereby setting the $\overline{\text{SCAN EN}}$ of the selected integrated circuit low. Except where otherwise noted, SYS CLOCK, SCAN ACLK, and SCAN BCLK are also all logic low.

Figure 12:
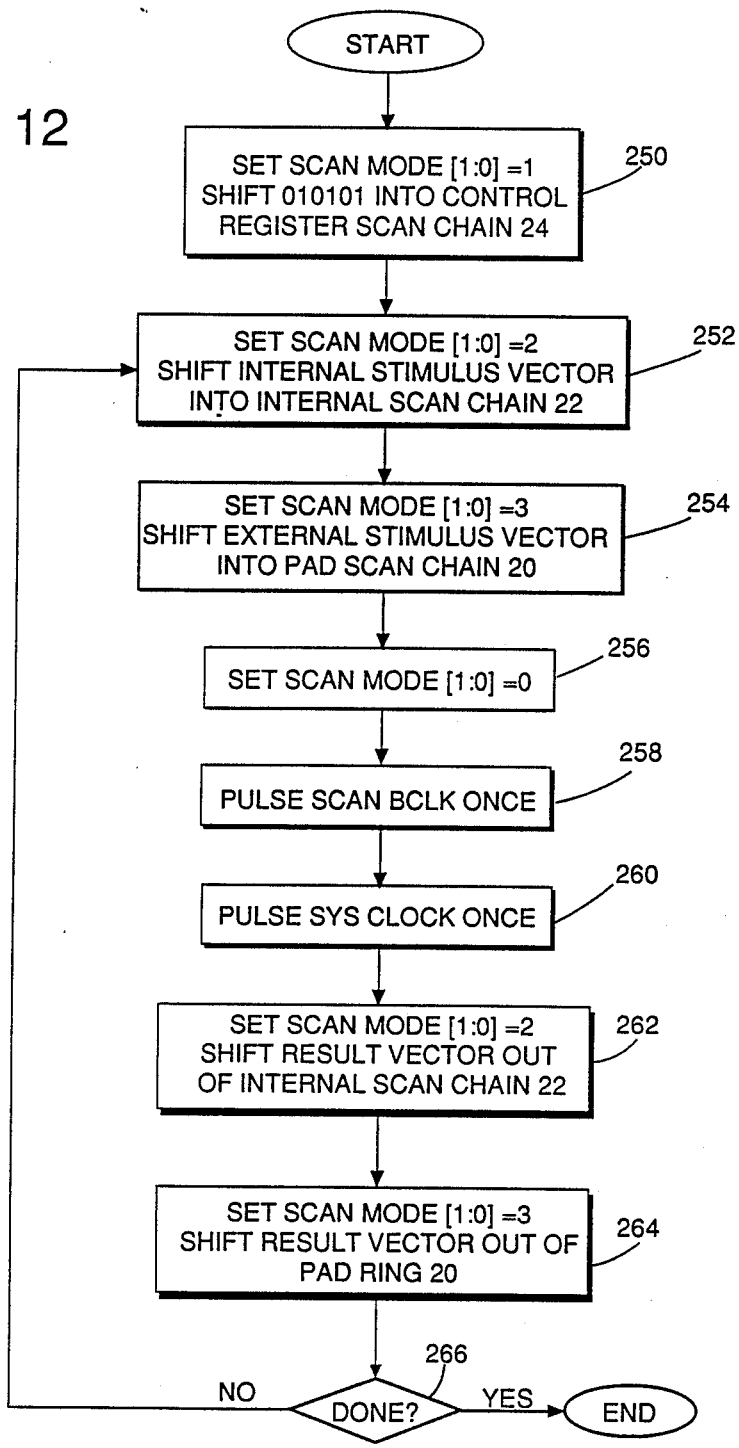
FIGS. 12–15 are flow charts for testing and initializing the integrated circuit of FIGS. 3A and 3B installed in the system of FIGS. 1 and 2.

Referring to FIG. 12, to apply test vectors and obtain corresponding result vectors, SCAN MODE [1:0] is set to 1 and 010101 shifted into control register scan chain 24 (250). This sets the TST, TSD, and LOG configuration bits. SCAN MODE [1:0] is then set equal to 2 and the internal stimulus vector shifted into the asic's internal scan chain 22 (252). Then, SCAN MODE [1:0] is set to 3 and the external stimulus vector is shifted into pad ring pad scan chain 20 (254).

SCAN MODE [1:0] is reset to 0 (256) to place integrated circuit 10 in the "internal test mode" (due to TST=1 and EXT=0— as set in step 250). This allows a subsequent SCAN BCLK pulse (step 258) to be applied to pad ring elements 48e-48i as O PAD EN to strobe those elements. The output portion of pad ring 20 (i.e. elements 48e-48i) is strobed by pulsing SCAN BCLK once (258) to capture the result vector generated by the primary outputs of asic 16 in slave latches 52 of elements 48e-48i. Then, the internal state of asic 16 is advanced by pulsing SYS CLOCK once (260). This captures another result vector generated by the functional circuitry in asic 16 (e.g., logic networks 120-124—FIG. 8) in the asic's general registers (e.g., registers 130-134—FIG. 8).

Next, SCAN MODE [1:0] is again set equal to 2 and the result vector generated by the pulsing of SYS CLOCK (260) is shifted out of internal scan chain 22 (262). SCAN MODE [1:0] is set equal to 3 and the result vector in elements 48e-48i is shifted out of pad ring scan chain 20 (264). The procedure then returns to step 252 unless all required test vectors have been entered (266).

Figure 13:
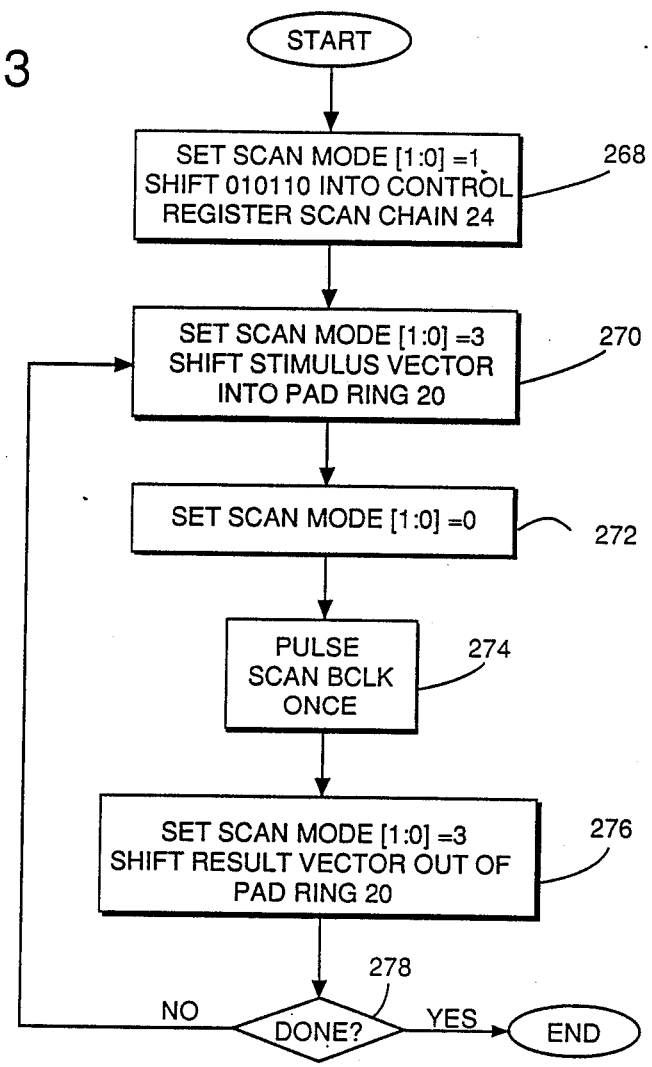

Referring to FIG. 13, the asic memory 76 in the selected integrated circuit is read by first setting SCAN MODE [1:0] to 1 and shifting 010110 into control register scan chain 24 (268). This sets the TST, TSD, and MEM configuration bits. Then, SCAN MODE [1:0] is set to 3 and a stimulus vector shifted into pad ring 20 (270). The stimulus vector is selected so that, when fully shifted into pad ring 20, a predetermined memory address is contained in the pad ring scan elements associated with the primary input pads 78 multiplexed to the ADDR inputs of memory 76 by multiplexer 82. Thus, memory 76 is addressed directly via the known data in the pad ring elements.

SCAN MODE [1:0] is then set to 0 (272) to place the integrated circuit in the "internal test mode". Thus, when SCAN BCLK is pulsed once (274), an O PAD EN pulse is applied to pad ring output elements 48e-8i and the memory's data outputs (a result vector), coupled via muxes 86, 94 to pads 80, are captured in elements 48e-48i (i.e. latched in slave latches 52 thereof). SCAN MODE [1:0] is set to 3 and the result vector is shifted out of pad ring 20 (276). The process returns to step 270 unless all stimulus vectors have been entered (278).

Figure 14:
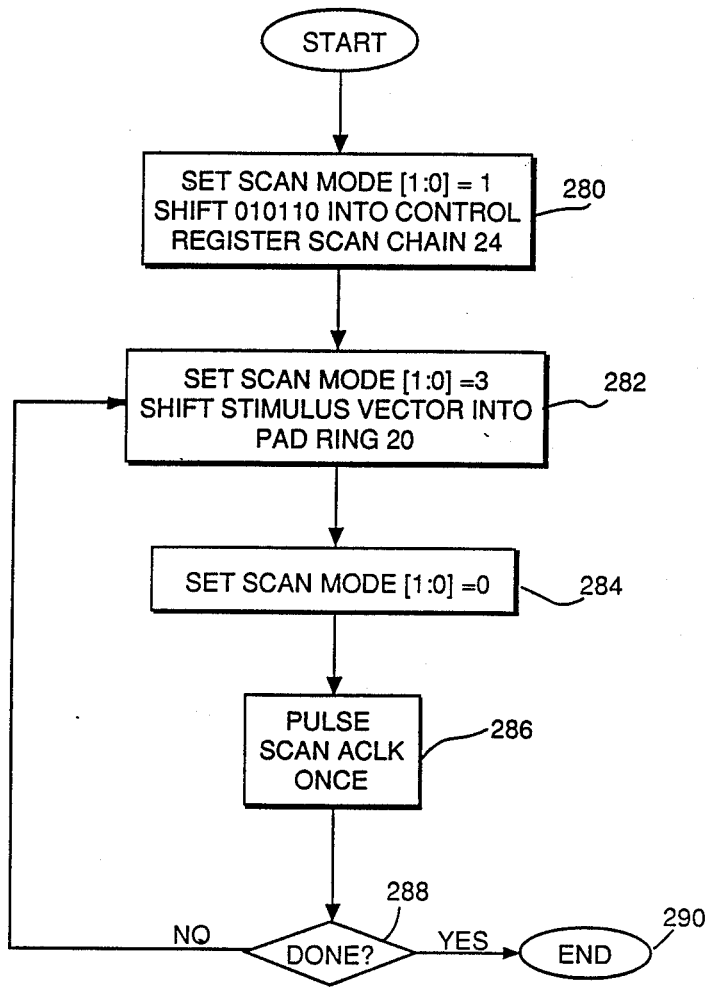

Referring to FIG. 14, asic memory 76 is written into by first setting SCAN MODE [1:0] to 1 and shifting 010110 into control register scan chain 24 (280), thereby setting the TST, TSD, and MEM configuration bits. SCAN MODE [1:0] is then set to 3 and a predetermined stimulus vector shifted into pad ring 20 (282) to place a selected memory address in the pad ring elements associated with the ADDR inputs of memory 76 (via mux 82). The predetermined stimulus vector is also selected to place a known data word in the pad ring elements associated (via mux 82) with the data inputs of asic memory 76 and to place a logic high in the pad ring elements associated with the write enable ($\overline{\text{WE}}$) input of memory 76 (via mux 84).

Then, SCAN MODE [1:0] is reset to 0 to place the integrated circuit in the "internal test mode" (284). Next, SCAN ACLK is pulsed once, causing scan enable circuit 102 (FIG. 6) to produce a $\overline{\text{RAM ENB}}$ pulse, which is applied to the $\overline{\text{WE}}$ input of memory 76 via the SCAN WE output of scan control section 18. This writes the data from the pad ring elements into the memory address contained in the pad ring latches (286). If all of the required RAM addresses have been written (288) the procedure is complete (290). If not, the process returns to step 282.

Figure 15:
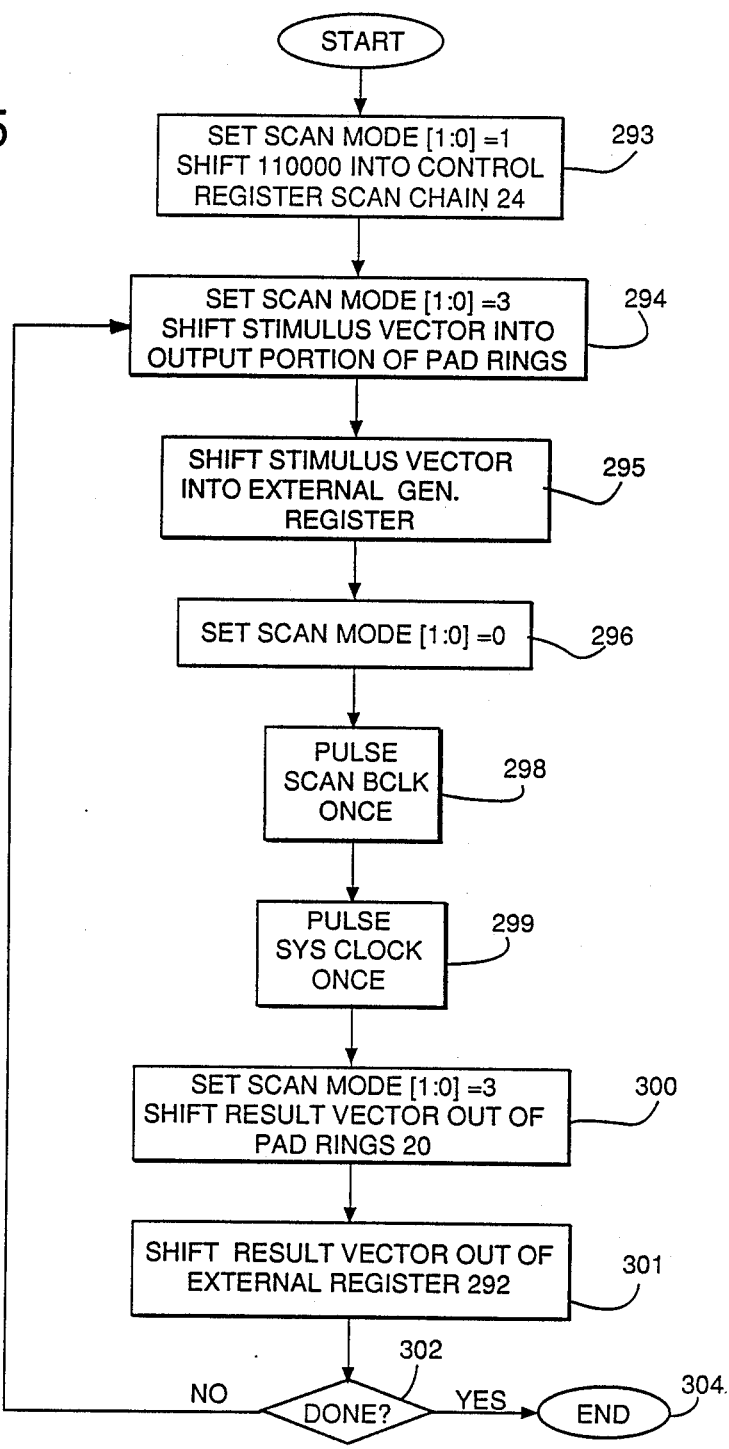
Figure 16:
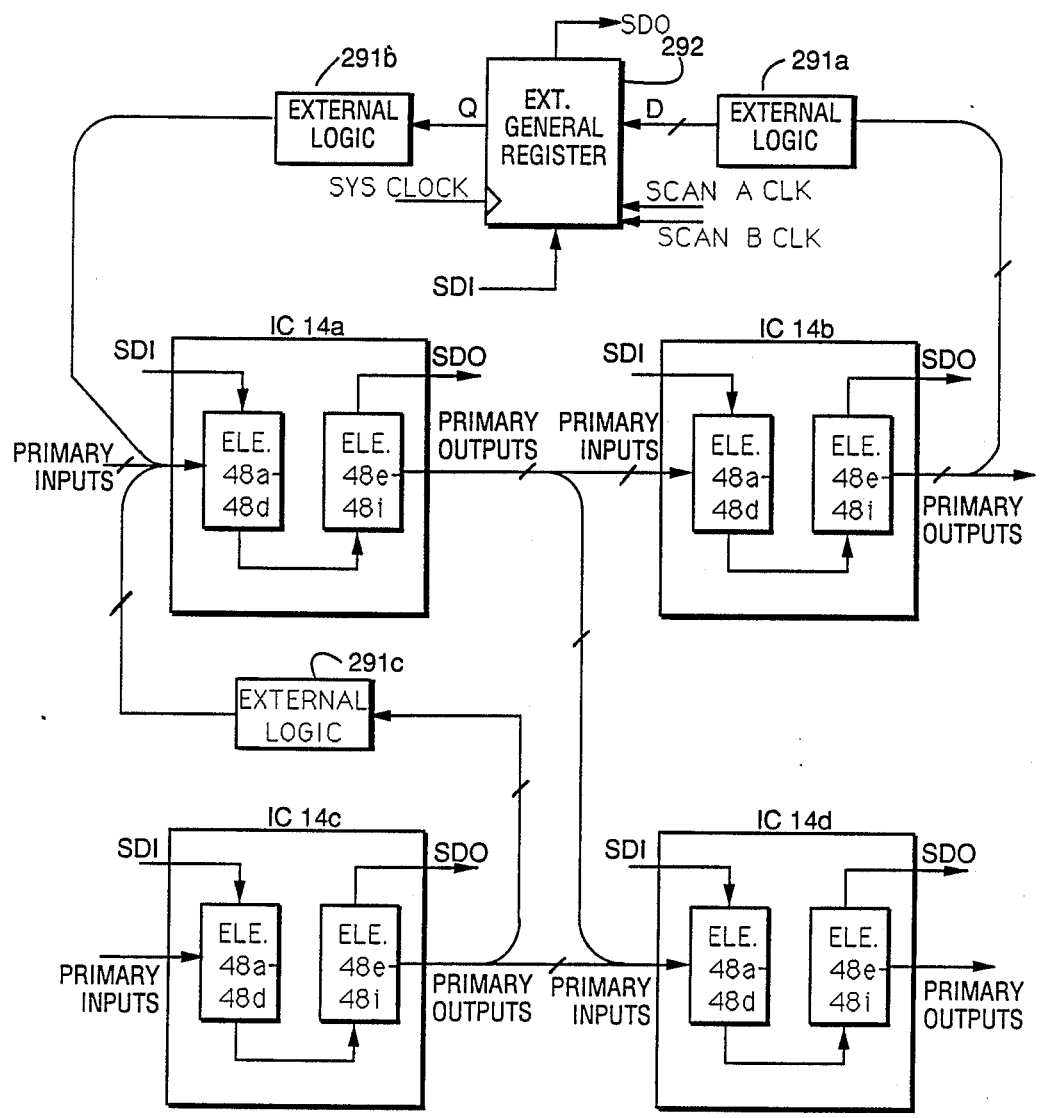
FIG. 16 is a block diagram useful in understanding the test procedure illustrated in FIG. 15.

Referring to FIGS. 15 and 16, connectivity between integrated circuits (e.g., ICs 14a-14d on PCB 12a) is tested in the following manner. Primary inputs (i.e., inputs A-D—FIG. 3) and primary outputs (i.e., outputs A-D) of different integrated circuits may be directly connected together or coupled together through external logic networks 291a-291c. One or more scannable external general registers 292 (similar to general registers 72a-72e of FIG. 5) are chained together and disposed on PCB 12, for example between external logic networks 291a, 291b.

To test the interconnections of integrated circuits 14a-14d, directly and through external logic networks 291a-291c, SCAN MODE [1:0] is first set to 1 and configuration word 110000 is shifted into control register 24 of integrated circuits 14a-14d (293). This sets the EXT and TST configuration bits. Then, SCAN MODE [1:0] is set to 3 and stimulus vectors are successively shifted into output elements 48e-48i of pad ring scan chains 20 (FIGS. 3A and 3B) of integrated circuits 14a-14c (294).

Next, a stimulus vector is shifted into external general register 292, using SCAN ACLK and SCAN BCLK (295). SCAN MODE [1:0] is set to 0, placing integrated circuits 14a-14d in the "external test mode" (296). The input pad ring elements 48a-48d of integrated circuits 14a-14d are then strobed by pulsing SCAN BCLK once (298). This captures result vectors generated by external logic networks 291a-291c (in response to the stimulus vectors) in elements 48a-48d of IC 14a. Strobing SCAN BCLK also captures the primary outputs of IC's 14a, 14c (i.e. the stimulus vectors latched into pad ring elements 48e-48i of IC's 14a, 14c in step 294) in pad ring input elements 48a-48d of IC's 14b, 14d.

Then, SYS CLOCK is pulsed once (299), advancing the state of the asics in ICs 14a-14d and storing the resultant outputs of logic network 291a in external register 292. SCAN MODE [1:0] is set to 3 and the result vectors previously strobed into pad ring elements 48a-48d of the integrated circuits are shifted out of pad rings 20, one pad ring 20 at a time. Then, the result vector is shifted out of external register 292 (301) If all stimulus vectors have been entered (302), the test is complete (304). If not, the test procedure returns to step 294.

Other embodiments are within the scope of the following claims.

What is claimed is:

1. A digital system comprising
a plurality of integrated circuits disposed on a circuit board, each integrated circuit comprising a plurality of scan chains,
each said scan chain scanning data from a scan input thereof to a scan output thereof in response to a scan clock, each said scan input being coupled to a first pad of said integrated circuit, the scan outputs being multiplexed to a second pad of said integrated circuit,
said second pad of at least one of said plurality of integrated circuits being multiplexed with said second pad of another one of said integrated circuits to a port of said circuit board,
a controller for selecting one of said plurality of integrated circuits for scanning, said controller selecting the second pad of said selected integrated circuit for coupling to said port of said circuit board, and
said controller further selecting one of said plurality of scan chains in said selected integrated circuit for scanning, said controller coupling said scan clock to said selected scan chain and selecting the scan output of said selected scan chain for coupling to said second pad of said selected integrated circuit.

2. The digital system of claim 1 wherein at least one of said plurality of scan chains in at least one of said plurality of integrated circuits comprises a set of scannable elements, each said scannable element being disposed between a pad and functional circuitry of said integrated circuit and comprising
a switch, responsive to a control signal, for coupling data between said pad and said functional circuitry in a first operating mode, and
a latch for storing said data, and wherein
said switch decouples said pad from said functional circuitry in a second operating mode.

3. A digital system comprising
a plurality of circuit boards, each circuit board including a plurality of integrated circuits, each said integrated circuit comprising a plurality of scan chains,
each said scan chain scanning data from a scan input thereof to a scan output thereof in response to a scan clock, each said scan input being coupled to a first pad of the integrated circuit, the scan outputs being multiplexed to a second pad of the integrated circuit,
said second pad of at least one of said plurality of integrated circuits of each said circuit board being multiplexed with said second pad of another one of said integrated circuits to a port of said circuit board,
said port of at least one of said plurality of circuit boards being multiplexed with said port of another one of said circuit boards to a system output port,
a controller for selecting one of said plurality of circuit boards for scanning, said controller selecting said port of said circuit board for coupling to said system output port,
said controller further selecting one of said plurality of integrated circuits on said selected one of said circuit boards for scanning, said controller selecting the second pad of said selected integrated circuit for coupling to said selected port of said selected circuit board, and
said controller further selecting one of said plurality of scan chains in said selected integrated circuit for scanning, said controller coupling said scan clock to said selected scan chain and selecting the scan output of said selected scan chain for coupling to said selected second pad of said selected integrated circuit.

4. The digital system of claim 3 wherein at least one of said plurality of scan chains in at least one of said plurality of integrated circuits comprises a set of scannable elements, each said scannable element being disposed between a pad and functional circuitry of said integrated circuit and comprising
a switch, responsive to a control signal, for coupling data between said pad and said functional circuitry in a first operating mode, and
a latch for storing said data, and wherein
said switch decouples said pad from said functional circuitry in a second operating mode.

* * * * *